United States Patent
Scheffer et al.

(10) Patent No.: US 7,082,588 B2
(45) Date of Patent: Jul. 25, 2006

(54) METHOD AND APPARATUS FOR DESIGNING INTEGRATED CIRCUIT LAYOUTS

(75) Inventors: Louis K. Scheffer, Campbell, CA (US); Steven Teig, Menlo Park, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 12 days.

(21) Appl. No.: 10/836,581

(22) Filed: May 1, 2004

(65) Prior Publication Data

US 2005/0246674 A1    Nov. 3, 2005

(51) Int. Cl.
G06F 17/50    (2006.01)

(52) U.S. Cl. .............................. 716/8; 716/5

(58) Field of Classification Search .................... 716/1, 716/5, 8
See application file for complete search history.

(56) References Cited

U.S. PATENT DOCUMENTS

| | | | |
|---|---|---|---|
| 5,784,289 A | | 7/1998 | Wang |
| 6,574,782 B1 | | 6/2003 | Dewey, III et al. |
| 6,578,190 B1 | * | 6/2003 | Ferguson et al. ............. 716/21 |
| 6,721,938 B1 | * | 4/2004 | Pierrat et al. ................. 716/19 |
| 2004/0216065 A1 | * | 10/2004 | Cobb et al. ..................... 716/8 |
| 2005/0044514 A1 | * | 2/2005 | Wu et al. ........................ 716/5 |
| 2005/0076316 A1 | * | 4/2005 | Pierrat et al. .................. 716/4 |

OTHER PUBLICATIONS

U.S. Appl. No. 10/836,582, filed May 1, 2004, Louis Scheffer.
International Search Report, Oct. 12, 20005, Cadence, ISR of PCT Application based on U.S. Appl. No. 10/836,582.

* cited by examiner

Primary Examiner—Stacy A. Whitmore
(74) Attorney, Agent, or Firm—Stattler, Johansen & Adeli LLP

(57) ABSTRACT

A method for modifying an IC layout using a library of pretabulated models, each model containing an environment with a feature, one or more geometries, and a modification to the feature that us calculated to produce a satisfactory feature on a wafer. The model may also contain a simulation of the environment reflecting no processing variations and/or a re-simulation of the environment reflecting one or more processing variations. The model may also contain data describing an electrical characteristic of the environment as a function of one or more process variations and/or describing an adjustment equation that uses geometry coverage percentages of particular areas in the layout to determine an adjustment to the modification. In some embodiments, and upper layer for an upper layer of an IC are modified using information (such as a density map) relating to a lower layout for a lower layer of the IC.

41 Claims, 24 Drawing Sheets

ID CIRCUIT
METHOD AND APPARATUS FOR DESIGNING INTEGRATED CIRCUIT LAYOUTS

FIELD OF THE INVENTION

The present invention is directed towards method and apparatus for designing integrated circuit layouts.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers.

One example of a PD wiring model is the PD Manhattan wiring model, which specifies alternating layers of preferred-direction horizontal and vertical wiring. Another example of a PD wiring model is the PD diagonal wiring model, which specifies alternating layers of preferred-direction diagonal wiring. The PD diagonal wiring model can allow for shorter wiring distances than the PD Manhattan wiring model and can decrease the total wirelength needed to interconnect the electronic and circuit components of an IC.

Design engineers design IC's by transforming logical or circuit descriptions of the IC's into geometric descriptions, called layouts. To create layouts, design engineers typically use electronic design automation ("EDA") applications. These applications provide sets of computer-based tools for creating, editing, and analyzing IC design layouts. IC layouts include geometric representations of IC elements that are to be fabricated on a wafer, such as IC components, interconnect lines, via pads, etc. As such, IC layouts typically include several geometries such as (1) circuit modules (i.e., geometric representations of electronic or circuit IC components) with pins, (2) interconnect lines (i.e., geometric representations of wiring) that connect the pins of the circuit modules on a same layer, and (3) vias (i.e., geometric representations of non-planar wiring) that connect the pins of the circuit modules across different layers.

To fabricate an IC after designing of the IC layout is completed, a lithographic plate (photomask) is created based on the IC layout so that the photomask contains the various geometries of the IC layout. The various geometries contained on the photomask represent the IC elements (such as IC components, interconnect lines, via pads, etc.) to be created on a wafer in a particular circuit pattern, the wafer forming the base of the integrated circuit. The wafer will typically have a protective insulation layer and a light-sensitive photoresist layer placed on top. A light source and lens are used to focus light through the photomask onto the photoresist layer of the wafer so that selected areas of the photoresist layer are modified (typically weakened or strengthened). In doing so, the circuit pattern represented on the photomask is "imprinted" on the photoresist layer of the wafer. The modified areas of the photoresist layer (as well as the insulation layer beneath) is then etched away to produce the IC elements of the desired circuit pattern. Through multiple stages of designing, photomasking (lighting), and etching, multiple layers of the IC are created.

Typically, however, there is substantial disparity in the geometries as originally designed in the IC layout (and replicated on the photomask) and the resulting fabricated geometries actually produced on a wafer through the photomasking and etching processes. The disparity between the geometries designed in a layout and the resulting fabricated geometries is largely due to the fact that, in recent years, geometry dimensions have become smaller than the wavelength of light used in the photomasking process, thus making accurate reproduction of geometry dimensions problematic. In response, various optical methods, such as Resolution Enhancement Techniques (RET), have been developed to allow more accurate reproduction of geometry dimensions at sizes smaller than the wavelength of light used in the photomasking process. Use of Resolution Enhancement Techniques in IC fabrication, however, do not guarantee that geometries actually fabricated on a wafer will resemble (within a predetermined toleration threshold) the geometries originally designed in an IC layout.

Disparity between a geometry designed in a layout and the resulting fabricated geometry is also caused by diffracted light that strikes the geometry from surrounding geometries, the light being diffracted off the surrounding geometries during the photomask processing of the surrounding geometries. This diffracted light can cause distortions or inaccuracies in the appearance of a geometry with which it makes contact. As such, with or without the use of RET, there is a degree of unpredictability in the fabrication of geometries on a wafer.

FIG. 1 shows an example of the variation that may result between an original geometry 105 as designed in an IC layout (and replicated on a photomask) and a fabricated geometry 120 actually produced on a wafer. In the example of FIG. 1, the original geometry 105 has five features of interest that are indicated by dots: four corner features 110 and one line-point feature 112. As shown in FIG. 1, the fabricated geometry 120 has four rounded corners 125 and a curved line segment 127. Typically in IC fabrication, the corners 125 of a geometry 120 produced on a wafer will have substantial error (i.e., will differ substantially from the corners 110 of the original geometry 105). Also, line segments of a fabricated geometry 120 can also have substantial error and be curved instead of straight, as shown in the example of FIG. 1.

Conventionally, modifications are made to geometries in the IC layout (and replicated on a photomask) to adjust for the errors in the resulting geometries fabricated on the wafer. FIG. 2 shows an example of modifications (correcting shapes) 230 placed on the original geometry 105 and a fabricated geometry 235 actually produced on the wafer. As shown in FIG. 2, the modifications 230 are placed at the corner features 110 of the original geometry 105 which produces less rounded corners 240 in the fabricated geometry 235. A modification 230 is also placed at the line-point feature 112 of the original geometry 105 which produces a less curved line segment 242 in the fabricated geometry 235. Note that although the fabricated geometry 235 produced through use of the modifications 230 is closer in appearance to the original geometry 105, there is still some disparity between the fabricated geometry 235 and the original geometry 105. Typically, modifications are made to original geometries to produce only satisfactory resulting geometries that are within an allowable threshold of variance from the original geometries.

Presently, there are two methods for creating modifications to original geometries in layouts. The first is a simulation-based approach where initial modifications are made to an original geometry in a layout and a computed simulation is performed on the original geometry to produce a simulated geometry. The simulated geometry is used to judge whether the modifications to the original geometry are satisfactory or not. If the modification to the original geometry has not produced a satisfactory simulated geometry, the modification is adjusted (e.g., made larger or smaller) and another simulated geometry is produced. This process is iterated until a satisfactory simulated geometry is produced. The simulation-based approach, however, requires that every geometry in a layout be iteratively simulated until a satisfactory geometry is produced. Considering that there may be billions of such geometries on a single layout, this approach can be very time intensive.

The second approach is a rule-based approach where modification rules are typically developed by an IC designer by hand. Such rules define what modifications are to be made to geometries in different situations. Although the rule-based approach is not as time-intensive as the simulation-based approach, a large number of rules must be developed to cover the various situations that may arise in an IC layout. Also, each modification rule may be complex and cumbersome to develop and apply.

As such, there is a need for a simple and efficient method for determining a modification to a geometry in a layout that is calculated to produce a satisfactory geometry when fabricated on a wafer.

SUMMARY OF THE INVENTION

Some embodiments of the invention provide a method for modifying features in an IC layout using a library of pretabulated models, each model containing a modification to a feature calculated to produce a satisfactory feature on a wafer. Each model also contains an environment of the feature that includes a geometry on which the feature is located and zero or more neighboring geometries. In some embodiments, a method for modifying features in an IC layout includes 1) selecting a feature in a layout for modification, 2) identifying an environment containing the feature, 3) identifying a model in a pretabulated library containing a matching environment, 4) retrieving a modification to the feature from the matching model, and 5) applying the modification to the feature in the layout. In some embodiments, the matching model also contains other data, such as simulated environment data, re-simulated environment data, electrical characteristic data, and/or an adjustment equation or function data. In these embodiments, the method retrieves (at step 4), any or all of the other types of data contained in the matching model.

In some embodiments, a method for building a library of pretabulated models includes 1) creating a set of example pretabulated environments, each pretabulated environment containing a feature and one or more geometries, 2) selecting a current environment in the set, 3) creating and applying a modification to the current feature in the current environment, 4) simulating the current environment with the modification, 5) repeating steps 3 and 4 until a satisfactory simulation of the current environment and current feature is achieved, 6) creating a model of the current environment by storing data of the current environment (with the last modification made) to the model, and 7) repeating steps 2 through 6 until all environments in the set are processed. In some embodiments, a set of environments in the library is tailored towards layouts having a particular preferred-direction wiring, such as Manhattan or diagonal preferred-direction wiring. In some embodiments, a set of environments in the library is tailored towards layouts not having a particular preferred-direction wiring, such as layouts designed in analog.

Some embodiments of the invention provide an alternative method for modifying features in an IC layout using a library of pretabulated models, the alternative method including 1) selecting a feature in the layout for modification, 2) identifying a layout environment containing the feature, 3) determining if a model in the library contains a matching environment, 4) if so, retrieving and applying a modification to the feature from the matching model, 5) if not, determining if a model in the library contains an environment within a predetermined variance from the layout environment, 6) if so, retrieving and applying a modification to the feature from the "matching" model, and 7) if not, creating and storing a new model in the library for the layout environment. In some embodiments, rather than performing steps 5 through 7, the method uses a conventional rule-based approach to determine a modification to the feature in the layout when a matching model is not found in the library. In some embodiments, the method is performed without a prior pretabulated library being created, but rather, simultaneously creates a library while modifying features in a layout, i.e., creates a pretabulated library "on-the-fly" during runtime when it is used to modify a layout.

In some embodiments, a model in the pretabulated library contains pretabulated environment data describing a pretabulated environment containing a feature, one or more geometries, and a modification to the feature. In some embodiments, the model also contains simulated environment data describing a simulated environment that is a prediction of how the pretabulated environment will appear once fabricated on a wafer assuming no processing variations. In some embodiments, the model also contains re-simulated environment data describing a re-simulated environment that is a prediction of how the pretabulated environment will appear once fabricated on a wafer assuming one or processing variations.

Some embodiments provide an alternative library building method for building a pretabulated library of models, each model containing simulated environment data and/or re-simulated environment data. In these embodiments, the library building method includes 1) creating a set of example pretabulated environments, each pretabulated environment containing a feature, 2) selecting a current environment in the set, 3) determining a modification to a feature in the current environment that produces a satisfactory simulated environment, 4) creating a model of the current environment by storing data of the current environment to the model, 5) storing simulated environment data describing the satisfactory simulated environment to the model, 6) producing a re-simulated environment of the current environment reflecting one or more process variations, 7) storing re-simulated environment data describing the re-simulated environment to the model, and 8) repeating steps 2 through 7 until all environments in the set are processed.

In some embodiments, the model also contains electrical characteristic data describing an electrical characteristic (such as capacitance, inductance, or resistance) of the pretabulated environment. In some embodiments, each model contains a characteristic equation that expresses an electrical characteristic of the pretabulated environment as a function of dimensions and placement of one or more geometries in the pretabulated environment and/or as a function of one or more process variations.

Some embodiments provide an alternative library building method for building a library containing capacitance equations, the method including 1) creating a set of example pretabulated environments, each pretabulated environment containing a pair of neighboring geometries, 2) selecting a current environment in the set, 3) simulating the current environment to produce an initial environment, 4) performing a three-dimensional (3D) electromagnetic simulation on the initial environment to find an initial capacitance ($C_0$) between the pair of neighboring geometries, 5) performing a re-simulation on the current environment taking into consideration example values of one or more process variations to produce a changed environment, 6) determining a distance difference ($\Delta W$) between the distances of the pair of neighboring geometries in the changed environment and the initial environment, 7) performing a 3D simulation on the changed environment to find a capacitance value (C) between the pair of neighboring geometries, 8) storing the capacitance value (C), the distance difference ($\Delta W$), and the example values of the one or more process variations as an example result, 9) repeating steps 5 through 8 a predetermined number of times to produce a set of example results, 10) determining a capacitance equation that considers all example results in the set, 11) storing the capacitance equation to a model for the current environment, and 12) repeating steps 2 through 11 until all environments in the set are processed.

In some embodiments, the model also contains adjustment equation or function data describing an adjustment equation or function that uses at least one geometry coverage percentage of a specific area in a design layout to determine an adjustment to a pretabulated modification in the model. Some embodiments provide an adjustment method for modifying geometries in an IC layout using a library of pretabulated models in conjunction with a predetermined adjustment equation or function. For each feature in the layout, the method includes 1) identifying a current environment containing the feature, 2) identifying a model in the library containing a matching environment, 3) retrieving, from the matching model, a modification to the feature and a predetermined adjustment equation used to adjust the modification, the adjustment equation containing one or more predetermined coefficients and one or more variables being geometry coverage percentages of particular areas in the layout, 4) determining geometry coverage percentages of areas specified in the adjustment equation, 5) determining an adjustment to be made to the modification using the adjustment equation, 6) applying the adjustment to the modification, and 7) applying the adjusted modification to the feature.

Some embodiments provide a library building method to produce a library containing predetermined adjustment equations or functions. For each pretabulated environment (containing an initial modification to a feature) in a set of pretabulated environments, the method includes 1) performing a simulation on the environment taking into consideration one or more example geometry coverage values of particular regions surrounding the feature, 2) adjusting the initial modification, 3) repeating steps 1 and 2 until a satisfactory simulation is produced, 4) determining a sum adjustment made to the initial modification, 5) storing the sum adjustment value and the one or more geometry coverage values as an example result, 6) repeating steps 1 through 5 a predetermined number times to produce a set of example results, 7) determining an adjustment equation that considers all example results in the set and explains how the sum adjustment value is derived from the one or more geometry coverage values, and 8) storing the adjustment equation to a model for the environment.

In some embodiments, geometries in an upper layout for an upper layer of an IC are modified using information relating to a lower layout for a lower layer of the IC. In some embodiments, geometries in the upper layout are modified using a density map of the lower layout. In some embodiments, geometries in a layout for a layer of an IC are modified based on topographic data (vertical deviation data) of the layout/layer.

Some embodiments provide a method for modifying a layout for an upper layer of an IC using information relating to a layout for a lower layer of the IC. The method includes 1) receiving an upper layout for an upper layer of an IC, the layout containing features and modifications to features, 2) retrieving data of a lower layout for a lower layer of the IC, 3) producing a density map of the lower layout indicating a percentage of geometry coverage in sub-regions of the lower layout, 4) selecting a current feature (having a modification) in the upper layout, 5) retrieving, from the density map, the percentage of geometry coverage of the sub-region of the lower layout that is below the current feature, 6) determining an estimate of vertical deviation of the current feature based on the geometry coverage percentage, 7) determining an alteration to the modification of the current feature based on the vertical deviation, 8) applying the alteration to the modification of the current feature, and 9) repeating steps 4 through 8 until all features in the upper layout are processed.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

The description that follows is divided into six sections. A general method for designing integrated circuit layouts and general terms and concepts are discussed below in Section I. Section II then describes methods for modifying geometries in an IC layout using a library of pretabulated models, each model describing an environment (a sub-region of the IC layout) and a modification to be applied to a geometry or feature in the environment. Section III describes alternative methods of modifying geometries in an IC layout using the library of pretabulated models. Section IV describes other data that can be contained in a model of the library, such as simulation data or electrical data of the environment described in the model. Section V describes methods of modifying geometries in an IC layout using the library of pretabulated models in conjunction with equation or function-based methods. And Section VI describes methods for modifying geometries in a layout for a layer of an IC using information relating to a layout for another layer of the IC.

Section I: General Method for Designing, Terms, and Concepts

Figure 1:
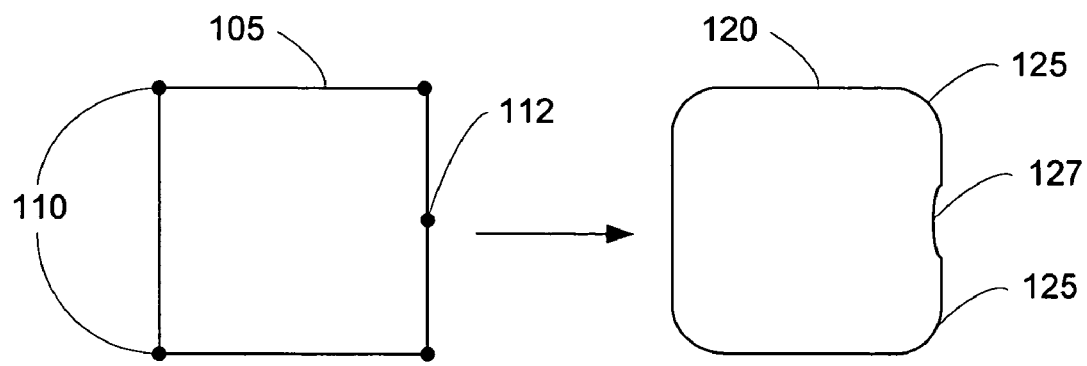
FIG. 1 shows an example of the variation that may result between an original geometry as designed in an IC layout and a fabricated geometry actually produced on a wafer.
Figure 2:
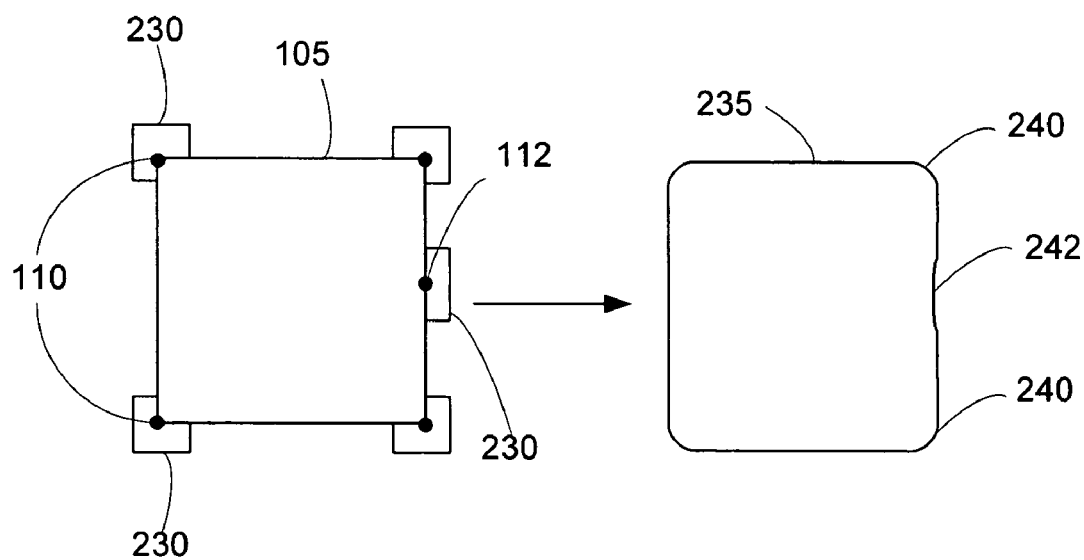
FIG. 2 shows an example of modifications placed on the original geometry and a fabricated geometry actually produced on the wafer.
Figure 3:
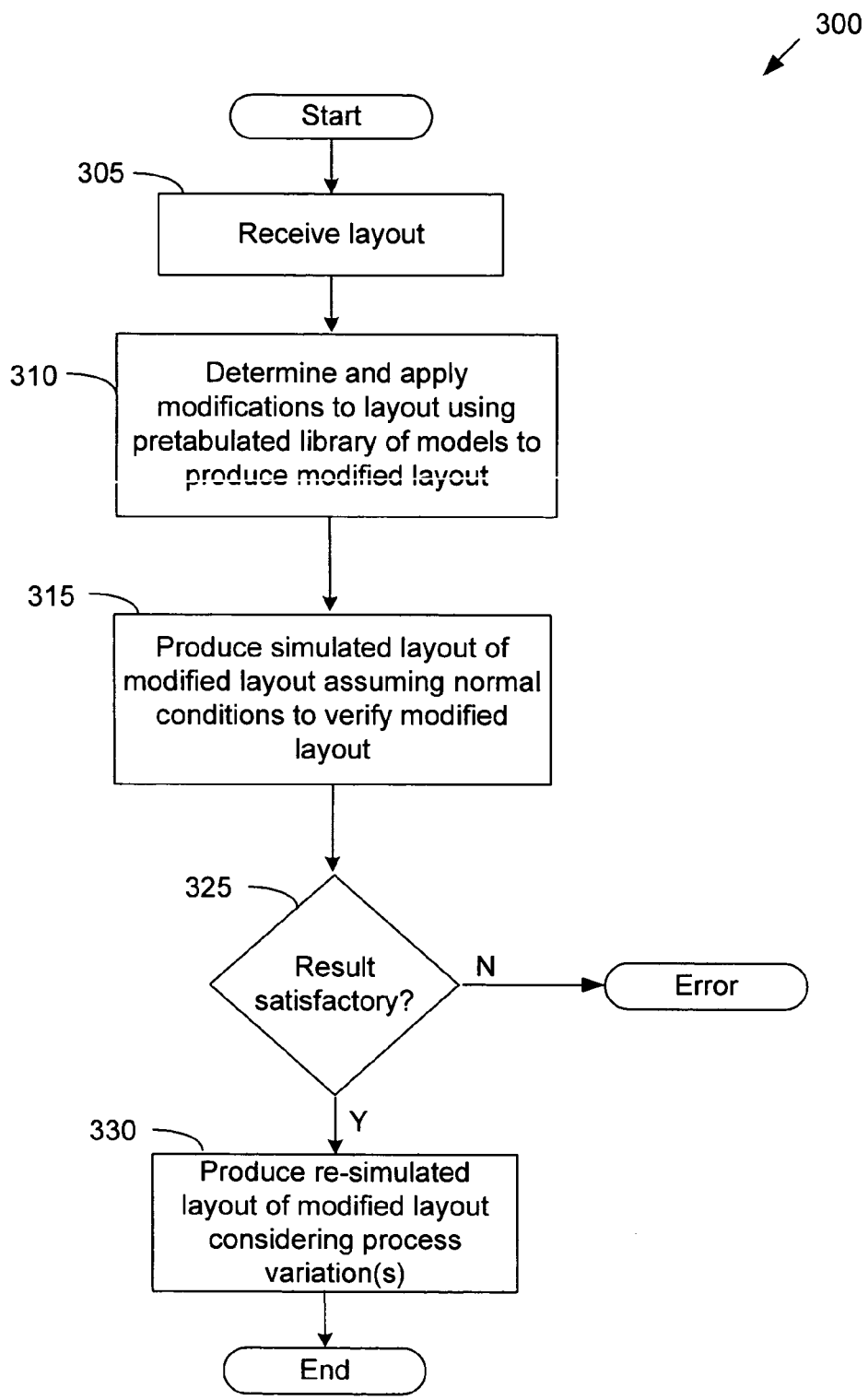
FIG. 3 is a flowchart of a general design method for designing integrated circuit layouts.

FIG. 3 is a flowchart of a general design method 300 for designing integrated circuit layouts. The method 300 can be implemented, for example, by an electronic design automation ("EDA") application that creates, edits, or analyzes IC design layouts. The general design method 300 begins when an original design layout is received (at 305) that contains a plurality of geometries, each geometry having zero or more features. The original design layout is typically designed by design engineers.

Modifications to geometries and features of the layout are then determined and applied to the design layout to produce (at 310) a modified layout. In some embodiments, modifications to a layout are determined using a library of pretabulated models, each model containing a modification to be applied to a geometry or feature in the layout (as described in Section II). The library of models is pretabulated so as to produce a modified layout that results in a satisfactory simulated layout, i.e., a simulated layout that is within a predetermined threshold of variance from the original layout (received at 305) in appearance.

Note that the following steps 315 through 330 of the method 300 are completely optional. A simulated layout of the modified layout is then produced (at 315) using a simulator program. The simulated layout is used to verify that the modified layout produces a satisfactory simulated layout. The simulated layout is a prediction of how the modified layout will appear once fabricated on a wafer and is produced by a simulator program that assumes no processing variations (i.e., assumes "normal" processing conditions). In some embodiments, in producing the simulated layout, the simulator program considers various factors, such as the properties of the photoresist layer, the effect of the optics of the exposing machine, the properties of the light source, the properties of the etching machines used in the photomasking process, etc.

The method then determines (at 325) whether the simulated layout is satisfactory, i.e., within a predetermined threshold of variance from the original layout (received at 305) in appearance. If not, an error has occurred as the modified layout is produced using a pretabulated library of models designed to produce a satisfactory simulated layout. If the modified layout produces a satisfactory simulated layout, the method proceeds to step 330. The modified layout that produced the satisfactory simulated layout can then be used to build a photomask that contains the various geometries and modifications of the modified layout.

At step 330, the method produces a re-simulated layout of the modified layout using a simulator program that takes into consideration one or more process variations (i.e., variations that occur during the fabrication of an IC). In some embodiments, in producing the re-simulated layout, the simulator program considers the same factors as for step 315 (e.g., the properties of the photoresist layer, the effect of the optics of the exposing machine used in the photomasking process, etc.) in addition to one or more specific process variations.

The re-simulated layout is also a prediction of how the modified layout will appear once fabricated on a wafer but is produced by a simulator program that assumes one or more processing variations, such as variations in lens focus or light exposure (light dosage) during the photomasking process. As such, in comparison to the simulated layout (produced at 315), the re-simulated layout reflects one or more processing variations and may vary significantly in appearance from the simulated layout. For example, geometries in the re-simulated layout may be thinner, thicker, or be shaped differently than corresponding geometries in the simulated layout.

In some embodiments, the re-simulated layout provides a prediction of how the modified layout will appear once fabricated considering a specific process variation having a specific value (e.g., lens focus variation having a defocus value of +10 nm). In some embodiments, one or more re-simulated layouts are produced (at 330). The general design method 300 then ends.

Note that the re-simulated layout (produced at 330) typically provides a highly accurate prediction of how the modified layout with actually appear once fabricated. As such, the re-simulated layout may be used by a design engineer to determine whether further modifications are to be made to the modified layout. In addition, the re-simulated layout may be input to various layout analysis programs, for example, to calculate electrical characteristics of the modified layout. However, such programs would require considerable time to reproduce the re-simulations performed at step 330.

In some embodiments, as described in Section IV, models of a pretabulated library contain data describing the simulation results of step 315 and/or the re-simulation results of step 330 (including a specific value for a specific process variation). By storing the simulation results of step 315 and/or the re-simulation results of step 330, these simulation results do not need to be reproduced, thus saving processing time. This can make it practical for uses (such as interactive viewing by a designer) where it was not practical before.

The IC design layout (received 305) will typically include several geometries such as (1) circuit modules (i.e., geometric representations of electronic or circuit IC components) with pins, (2) interconnect lines (i.e., geometric representations of wiring) that connect the pins of the circuit modules on a same layer, and (3) vias (i.e., geometric representations of non-planar wiring) that connect the pins of the circuit modules across different layers. A via includes (1) one pad on each of the two layers that it traverses and (2) a cut that is the three-dimensional hole between the two layers. A via pad has a particular shape when viewed from above and can comprise a geometry on an IC layer.

Figure 4:
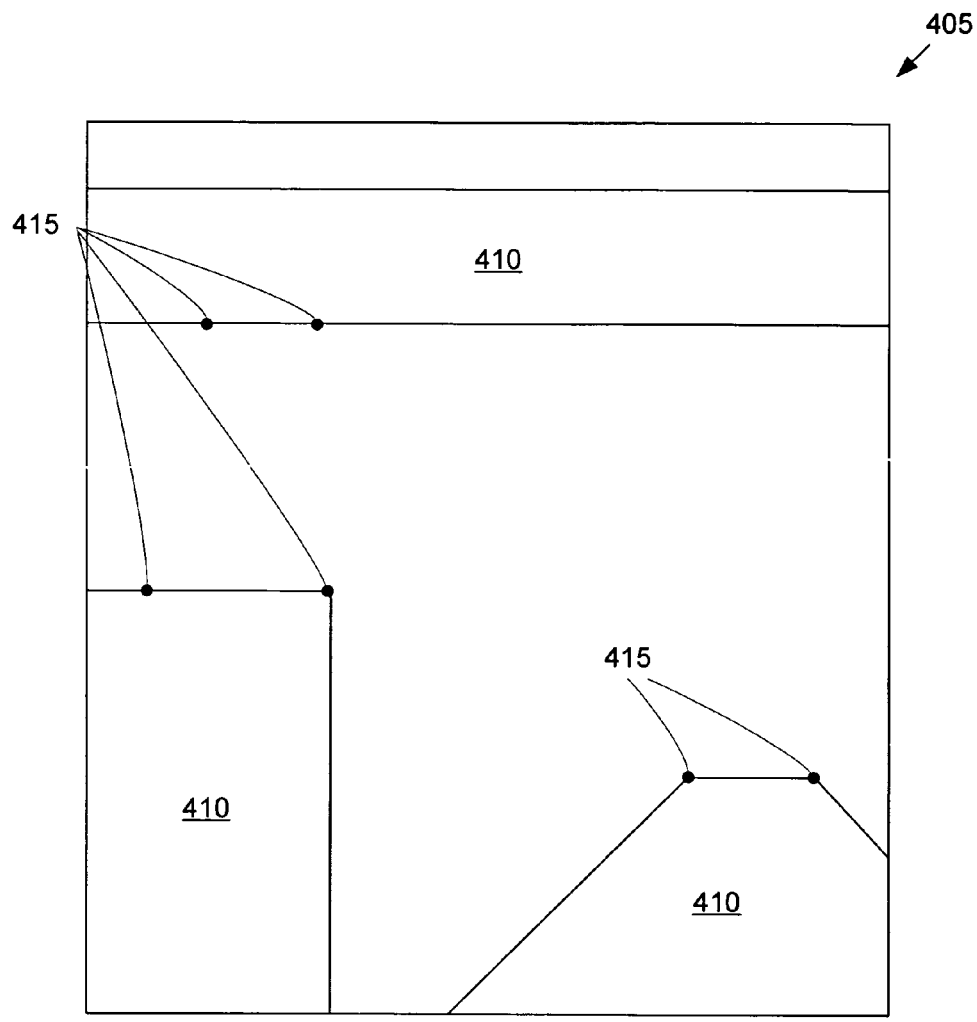
FIG. 4 shows a top-view diagram of a sub-region of a layout containing geometries that represent various IC elements such as circuit modules, interconnect lines, or via pads that are to be fabricated on a wafer.

FIG. 4 shows a top-view diagram of a sub-region 405 of a layout containing geometries 410 that may represent various IC elements such as circuit modules, interconnect lines, or via pads that are to be fabricated on a wafer. A geometry 410 may contain a feature 415 (indicated by dots), such as a corner (i.e., a point at which two sides of the geometry meet and form an angle of 90 degrees), a bend (i.e., a point at which two sides of the geometry meet and form an angle other than 90 degrees) or a point on a side of a geometry 410 (i.e., a line-point feature). As used herein, a geometry containing a feature that is currently being processed by the methods of the present invention is referred to as a primary geometry. Geometries neighboring the primary geometry are referred to as neighboring geometries.

Figure 5:
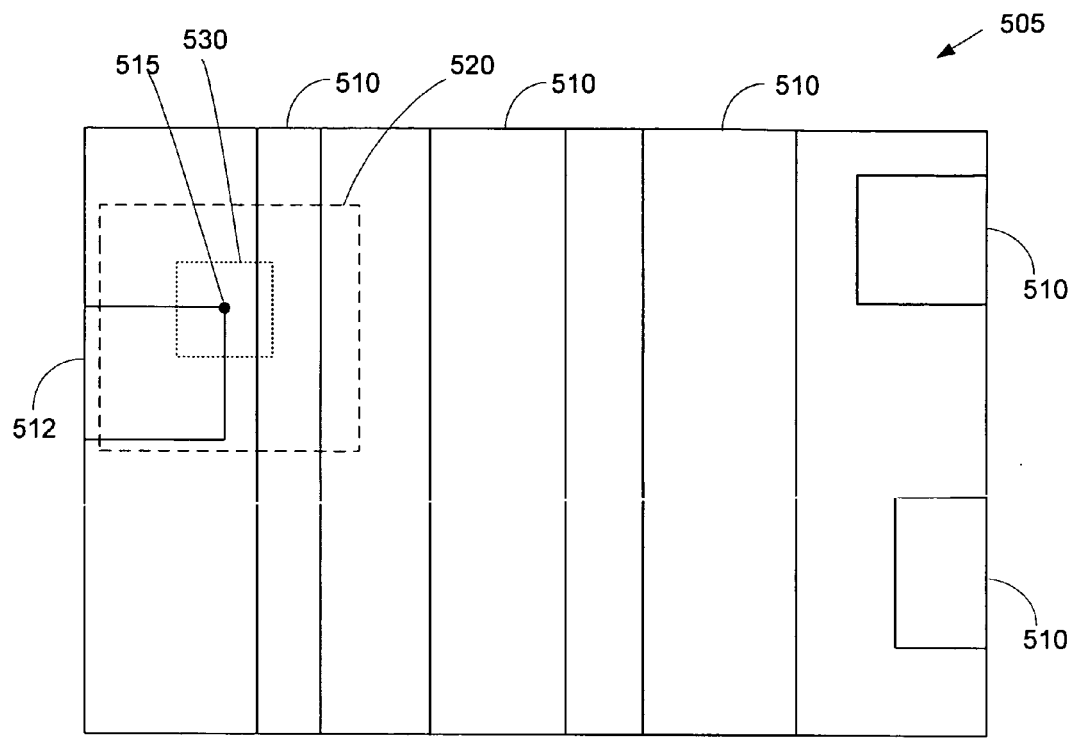
FIG. 5 shows a top-view diagram of a sub-region of a layout containing a primary geometry containing a current feature and an environment surrounding the current feature.

FIG. 5 shows a top-view diagram of a sub-region 505 of a layout containing a primary geometry 512 containing a current feature 515 and an environment 520 surrounding the current feature 515. Various neighboring geometries 510 are also shown located about the current feature 515. The environment 520 is a sub-region of a layout having a predetermined size and includes the current feature 515, part or all of the primary geometry 512 on which the current feature is located, and part or all of zero or more neighboring geometries 510. In the example shown in FIG. 5, the shape of the environment 520 is a four-sided polygon. In other embodiments, however, the environment 520 has another geometric shape, such as a circle or an octagon. In some embodiments, the environment 520 is a square with the current feature 515 placed in the center.

Figure 6:
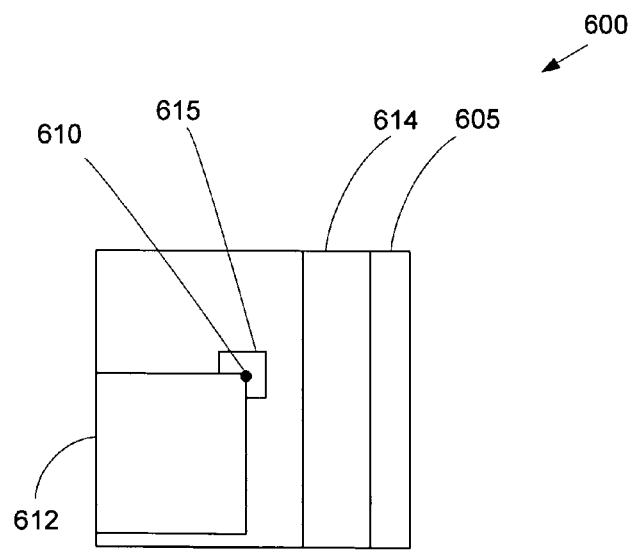
FIG. 6 is a conceptual diagram of a model containing descriptive data of a pretabulated environment that matches the layout environment of FIG. 5, the model being stored in a pretabulated library of models.

FIG. 6 is a conceptual diagram of a model 600 containing descriptive data of a pretabulated environment 605 that matches the layout environment 520 of FIG. 5, the model being stored in a pretabulated library of models. The pretabulated environment 605 has a predetermined size. In some embodiments, a model contains dimensions and placement data describing the environment surrounding a feature, a modification of the feature, the primary geometry on which the feature is located, and zero or more neighboring geometries that are included in the environment. In some embodiments, the descriptive data includes coordinate values of the feature, the modification, the primary geometry, and the zero or more neighboring geometries, the coordinate values being in relation to the position of the feature in the environment (e.g., where the feature is located in the center of the environment and has x and y coordinate values of 0, 0). In the example shown in FIG. 6, the environment 605 described in the model 600 contains a current feature 610, a modification 615 of the current feature 610, a primary geometry 612, and one neighboring geometry 614.

In some embodiments, a feature in an IC layout is processed by determining a layout environment surrounding the feature, finding a model in a pretabulated library having a matching pretabulated environment, and applying a modification contained in the model to the feature in the layout environment. For example, the feature 515 of FIG. 5 can be processed by determining the layout environment 520 surrounding the feature 515, finding the model 600 (of FIG. 6) having a pretabulated environment 605 that matches the layout environment 520, and applying the modification 615 contained in the model 600 to the feature 515 in the layout environment 520.

In some embodiments, after processing a feature 515 in a layout, a processed region 530 is identified about the feature 515, the feature 515 being located in the center of the processed region 530. The processed region 530 indicates that the modification made to the feature 515 is sufficient for the processed region 530 and processing of other features within the processed region 530 is unnecessary. The processed region 530 may be larger or smaller in size than the environment 520 surrounding the feature 515. The processed region 530 may be used to help select other features for processing (as discussed below in relation to FIG. 7).

Note that determining the dimensions and placement of a modification that produces a satisfactory feature on a wafer is based in large part by the environment surrounding the feature, such as the dimensions and placement of the primary and neighboring geometries. In other words, the environment surrounding the feature affects the modification that needs to be made to the feature to produce a satisfactory feature on the wafer. This is due to diffracted light that strikes the feature from the surrounding geometries, the light being diffracted off the surrounding geometries during photomask processing of the surrounding geometries. However, the farther away on a layout a surrounding geometry is to a feature, the less it affects the modifications made to the feature (since the amount of diffracted light that reaches the feature is less). These factors should considered when predetermining the size of the environment.

Following below is a list of terms and definitions used in this specification.

A "layout" feature, geometry, environment, or modification refers to a feature, geometry, environment, or modification as found in a layout.

A "pretabulated" feature, geometry, environment, or modification is a feature, geometry, environment, or modification that is described in a pretabulated model, the model being stored in a library of pretabulated models.

A "simulated" feature, geometry, environment, or layout of is a prediction of how a feature, geometry, environment, or layout will appear once fabricated on a wafer and is produced by a simulator program that assumes no processing variations (i.e., assumes "normal" processing conditions).

A "re-simulated" feature, geometry, environment, or layout of is a prediction of how a feature, geometry, environment, or layout will appear once fabricated on a wafer and is produced by a simulator program that assumes one or more processing variations. A re-simulated feature, geometry, environment, or layout does not necessarily mean that the feature, geometry, environment, or layout has been simulated before, but is used as a term to indicate a simulation reflecting one or more processing variations.

A fabricated feature, geometry, environment, or layout is a feature, geometry, environment, or layout actually produced on a wafer.

A model is said to contain a feature, geometry, environment, modification, equation, etc. when it contains data describing the feature, geometry, environment, modification, equation, etc. An environment is said to contain a geometry when it contains all or only a portion of the geometry.

Section II: Modifying Geometries Using a Pretabulated Library

Figure 7:
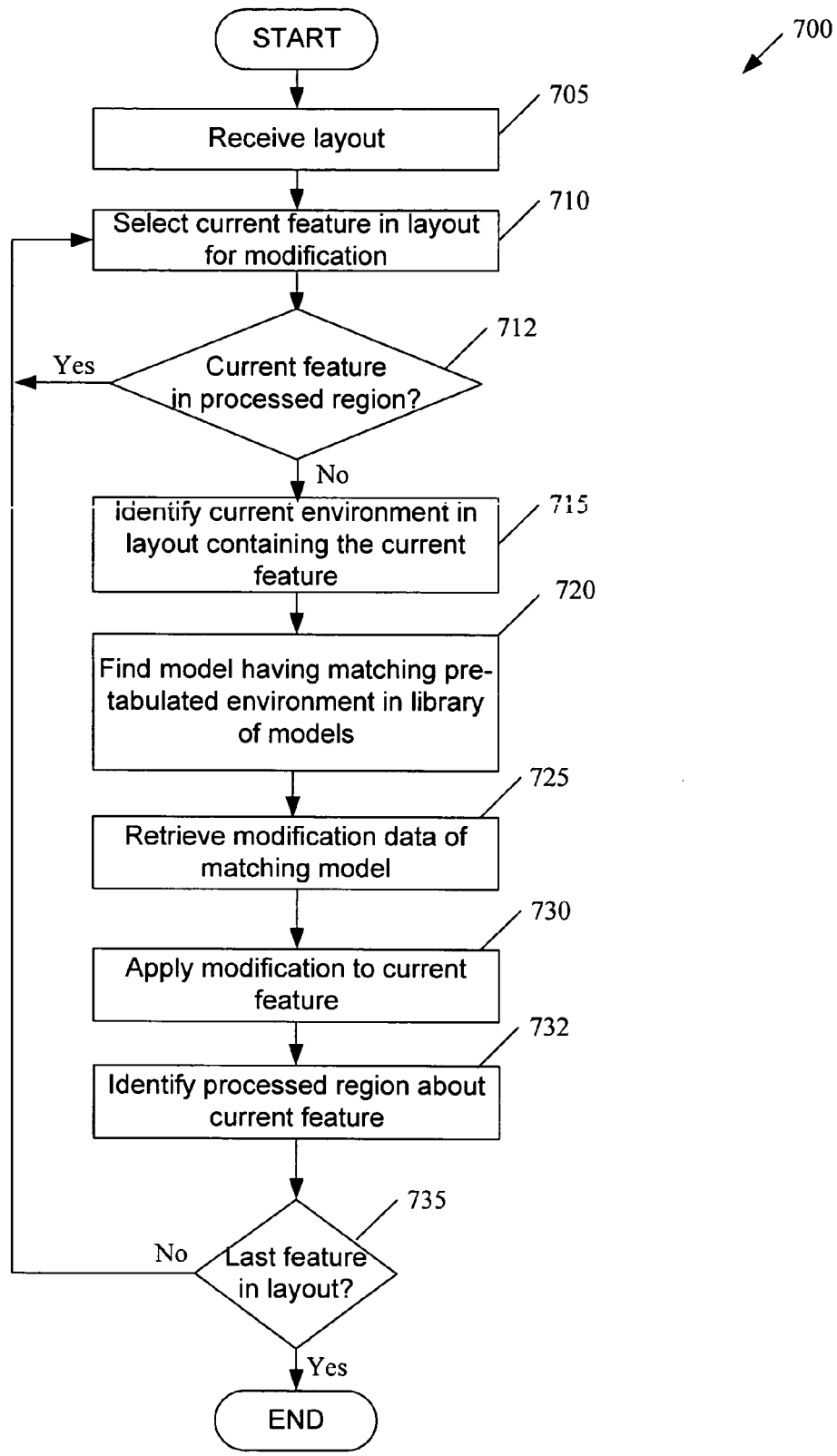
FIG. 7 is a flowchart of a layout modification method for modifying geometries in an IC layout using a library of pretabulated models.

Layout Modification Method Using a Library of Pretabulated Models:

FIG. 7 is a flowchart of a layout modification method 700 for modifying geometries in an IC layout using a library of pretabulated models, each model containing a modification to be applied to a geometry or feature in the IC layout. The layout modification method 700 comprises step 310 of the general design method 300 (of FIG. 3). As such, the method 700 receives a design layout and produces a modified layout. The method 700 can be implemented, for example, by an electronic design automation ("EDA") application that creates, edits, or analyzes IC design layouts.

The method 700 starts when it receives (at 705) an IC design layout having one or more geometries, each geometry containing zero or more features to be modified. The method then selects (at 710) a current feature in the layout for modification. In some embodiments, the method 700 first selects corner and bend features for processing, and after all corner and bend features have been processed, the method 700 then selects other features, such as line-point features, for processing. The method 700 then determines (at 712) if the current feature is located within a processed region. If so, the method 700 proceeds to step 710 where another current feature is selected. If not, the method 700 continues at step 715.

The method then identifies (at 715) a current environment in the layout containing the current feature, the current layout environment having a predetermined size. The current environment may be identified, for example, by setting the shape of the current environment as a square having a predetermined size and positioning the square so that the current feature is in the center. The current environment contains the current feature and one or more layout geometries. In other embodiments, a current environment is identified in another manner, for example, by using a different shape. An example of step 715 is shown in FIG. 5 where an environment 520 surrounding a current feature 515 is identified.

The method then identifies (at 720) a model containing a pretabulated environment that matches the current layout environment, the model being contained in a library of pretabulated models. The pretabulated environment has a predetermined size that is equal to the predetermined size of the current layout environment. Each model in the library is created for a specific feature (pretabulated feature) in a specific environment (pretabulated environment), the environment containing the feature, one or more geometries, and a modification to the feature. A method for building a library of pretabulated models is discussed below in relation to FIG. 8.

By comparing the dimensions and placement of the one or more geometries in the current environment with the one or more geometries in a pretabulated environment in a model, a model containing a pretabulated environment that matches the layout environment is found. A method for identifying a matching model (i.e., a model having a pretabulated environment matching the current layout environment) is discussed below in relation to FIG. 12. In this embodiment, it is assumed that a matching model is found in the library. Other embodiments, discussed below in Section III, consider the case where no matching model is found in the library.

The method then retrieves (at 725), from the matching model, data describing the pretabulated modification for a pretabulated feature, the pretabulated modification being designed to produce a fabricated feature on a wafer that is within a predetermined variance from the current layout feature and the pretabulated feature. Also, as discussed below, the pretabulated modification produces a simulated feature that is within a predetermined variance from the pretabulated feature. In some embodiments, the matching model also contains other data of the pretabulated environment, such as simulated environment data, re-simulated environment data, electrical characteristic data, and/or an adjustment equation or function data (as described in Section IV). In these embodiments, the method retrieves (at 725), any or all of the other types of data contained in the matching model. These other types of data may be used, for example, by a design engineer to determine how the pretabulated environment is predicted to appear once fabricated, the electrical characteristics of the pretabulated environment, etc.

The pretabulated modification is then applied (at 730) to the current feature in the design layout. The pretabulated modification has been created (as discussed below in relation to FIG. 8) based upon a pretabulated feature and environment in order to produce a satisfactory fabricated feature on a wafer. Since the pretabulated feature and environment have been determined to match the current feature and environment in the layout, applying the pretabulated modification to the current feature should also produce a satisfactory feature once the feature is fabricated on a wafer.

The method then identifies (at 732) a processed region about the current feature. The processed region indicates that the modification made to the current feature is sufficient for the processed region and processing of other features within the processed region are unnecessary. An example of step 732 is shown in FIG. 5 where a processed region 530 about a current feature 515 is identified.

The method then determines (at 735) if the current feature is the last feature on the design layout. If so, the method ends. If not, the method proceeds to step 710 where a next current feature in the layout is selected for processing.

Figure 8:
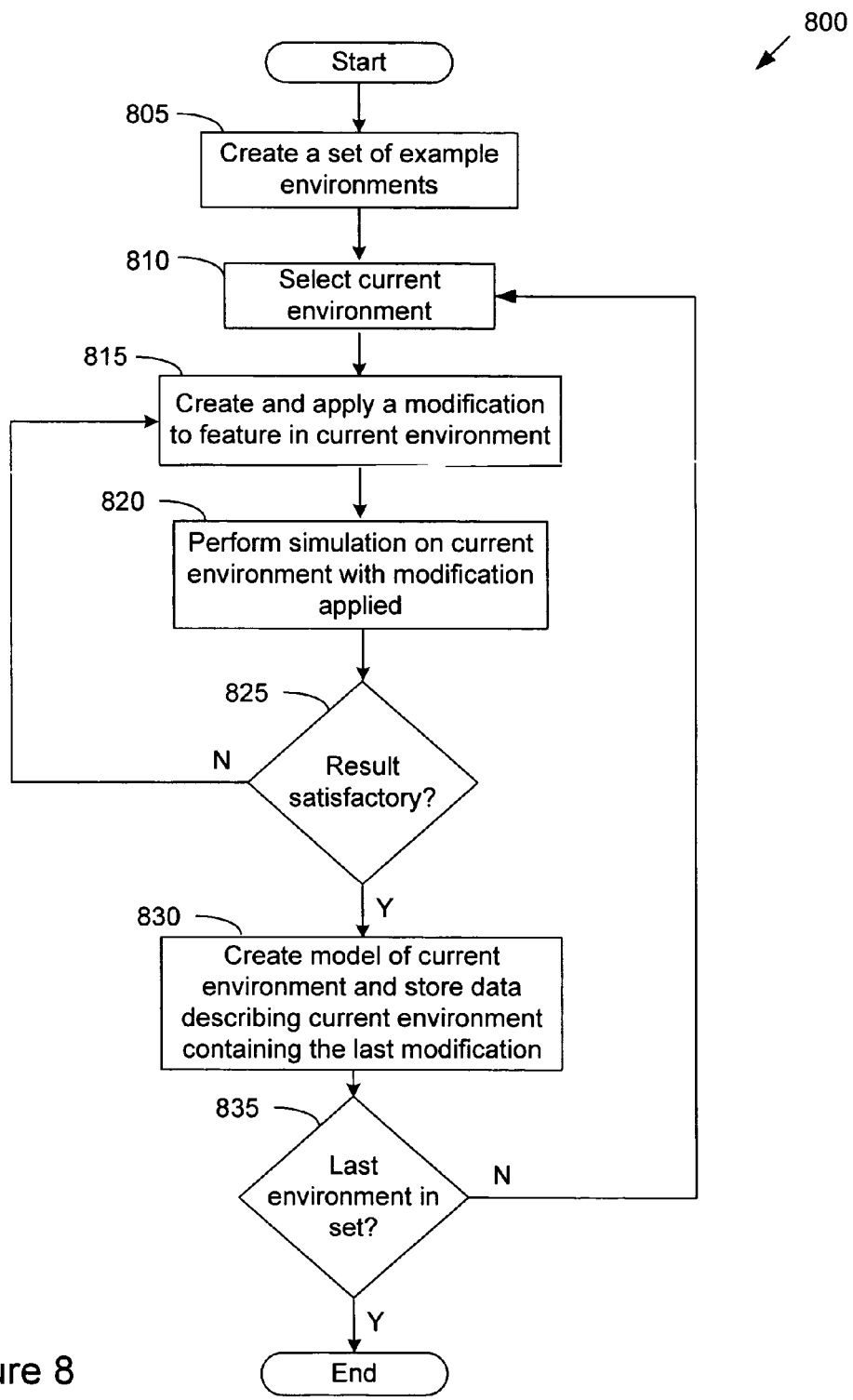
FIG. 8 is a flowchart of a method for building a library of pretabulated models.
Figure 9A:
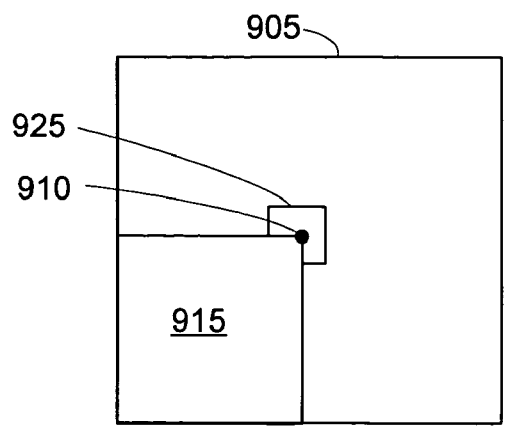
FIGS. 9A–9F show examples of environments that may be created for a Manhattan preferred wiring layout.
Figure 9B:
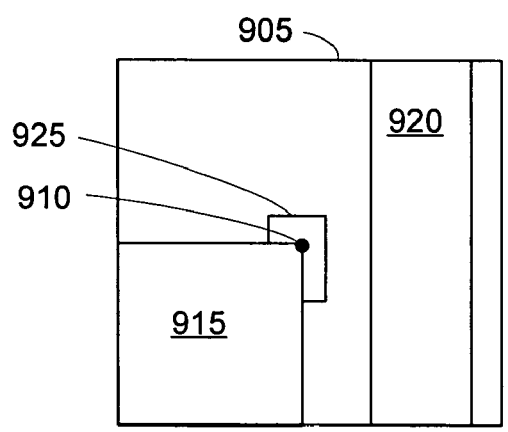
Figure 9C:
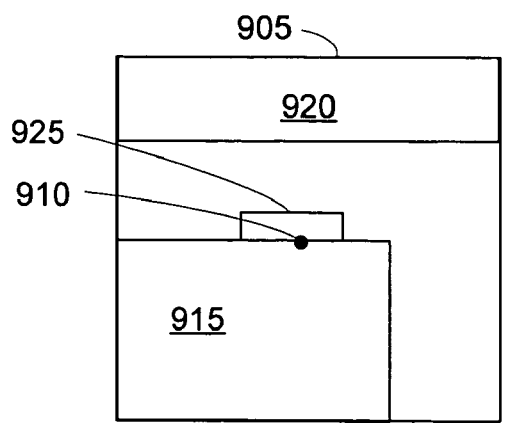
Figure 9D:
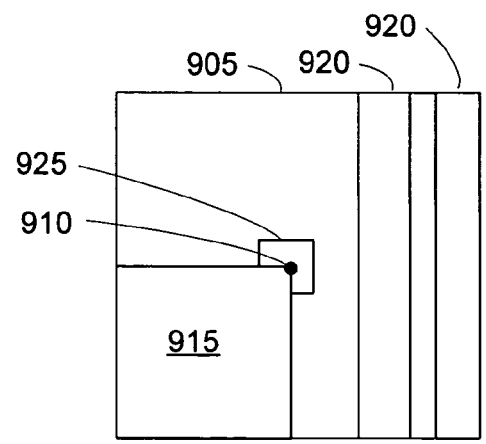
Figure 9E:
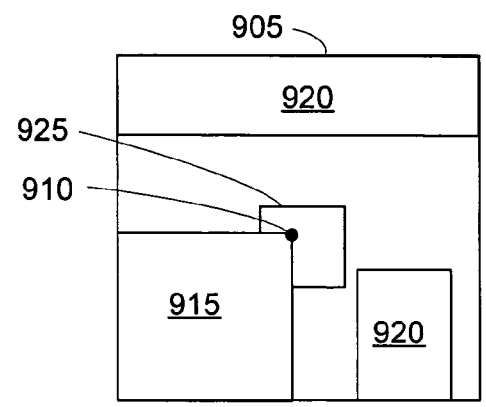
Figure 9F:
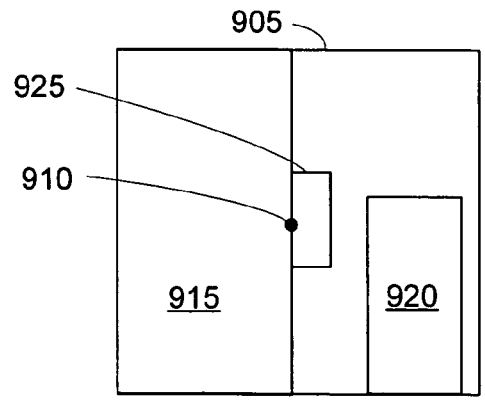

Building the Library of Pretabulated Models:

As stated above, the layout modification method 700 identifies (at 720) a model containing a pretabulated environment that matches a current layout environment, the model being contained in a library of pretabulated models. FIG. 8 is a flowchart of a method 800 for building a library of pretabulated models. FIG. 8 is described in relation to FIGS. 5, 6, 9A–9F, 10A–10C, and 11A–11C.

The method 800 begins by creating a set of pretabulated environments for the library, each pretabulated environment containing a feature (such as a corner or bend), a primary geometry on which the feature is located, and zero or more neighboring geometries. Typically, the set of pretabulated environments created for a library will cover a broad range of environments that may be found on an IC layout. The set of environments will typically cover a multitude of various feature and geometry configurations that can be encountered on an IC layout.

In some embodiments, a library or set of environments is tailored towards layouts having a particular preferred-direction wiring. As discussed above, IC's use preferred direction wiring models, which specify a preferred wiring direction for each of their wiring layers. For example, a layer may have Manhattan or diagonal preferred-direction wiring. Or, in the case of ICs that are designed in analog, a layer may have no preferred-direction wiring.

A layout for a layer having Manhattan preferred wiring will, for the most part, have geometries having sides that are horizontal or vertical in orientation (i.e., form an angle of 0° or 90° with respect to one of the coordinate axes of the layout which are typically parallel with the layout's boundary and/or the boundary of the layout's expected IC). As such, a library or set of environments tailored towards a Manhattan preferred wiring layout will contain environments having geometries with horizontal or vertical sides. FIGS. 9A–9F show examples of environments 905 that may be created for a Manhattan preferred wiring layout. As shown in FIGS. 9A–9F, each environment 905 contains a feature 910, a primary geometry 915 on which the feature 910 is located, and zero or more neighboring geometries 920. Note that the sides of the geometries 915 and 920 are horizontal or vertical in orientation.

Figure 10A:
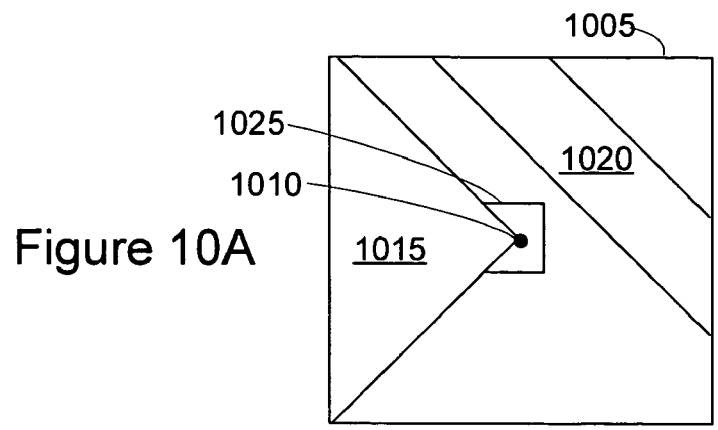
FIGS. 10A–10C show examples of environments that may be created for a diagonal preferred wiring layout.
Figure 10B:
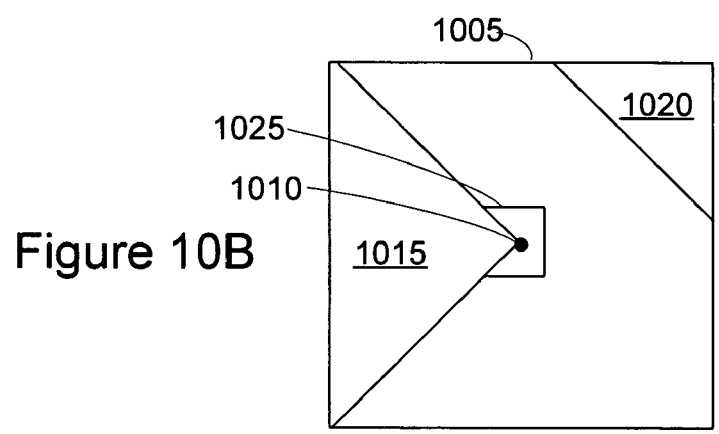
Figure 10C:
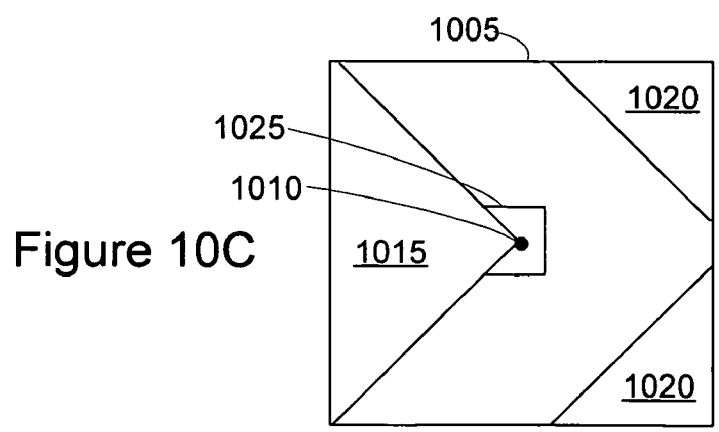

In contrast, a layout for a layer having diagonal preferred-direction wiring will, for the most part, have geometries having sides that are diagonal in orientation (i.e., form an angle of 45° or 135° with respect to one of the coordinate axes of the layout). As such, a library or set of environments tailored towards diagonal preferred wiring layout will contain environments having geometries with diagonal sides. FIGS. 10A–10C show examples of environments 1005 that may be created for a diagonal preferred wiring layout. As shown in FIGS. 10A–10C, each environment 1005 contains a feature 1010, a primary geometry 1015 on which the feature 1010 is located, and zero or more neighboring geometries 1020. Note that the sides of the geometries 1015 and 1020 are diagonal in orientation.

Figure 11A:
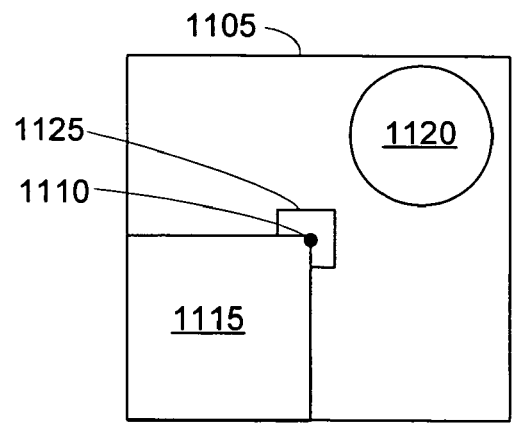
FIGS. 11A–11C show examples of environments that may be created for an analog designed layout.
Figure 11B:
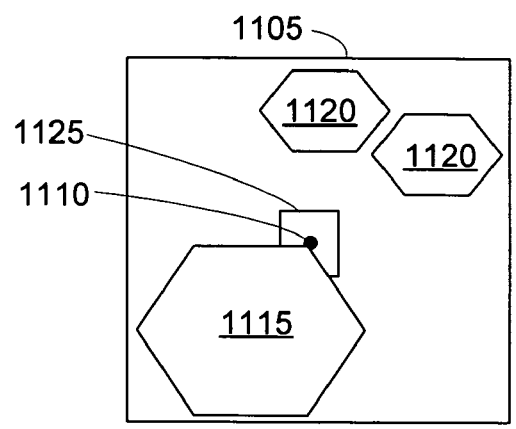
Figure 11C:
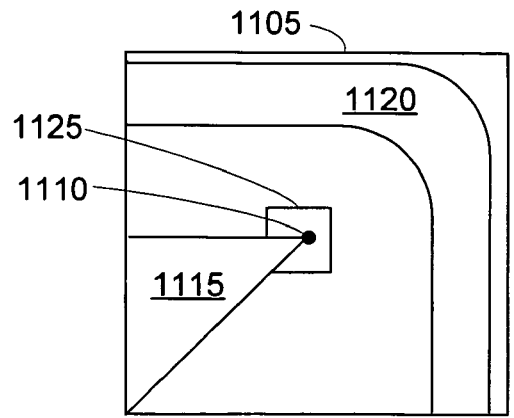

Or, in the case of ICs that are designed in analog, a layer may have no preferred-direction wiring. As such, a library or set of environments tailored towards analog designed ICs will contain environments having geometries of any shape or orientation. FIGS. 11A–11C show examples of environments 1105 that may be created for an analog designed layout. As shown in FIGS. 11A–11C, each environment 1105 contains a feature 1110, a primary geometry 1115 on which the feature 1110 is located, and zero or more neighboring geometries 1120.

After a set of environments is created (at step 805), the method 800 then determines (at steps 810 through 835) a modification that is to be applied to a feature of each pretabulated environment that is predicted to produce a satisfactory feature once the feature is fabricated on a wafer. A modification to a feature in an environment is based upon the primary geometry and any neighboring geometries contained in the environment. In other words, the geometries surrounding the feature affect the modification that is calculated for the feature.

At step 810, the method 800 selects an environment in the set of pretabulated environments as a current pretabulated environment. The method then creates and applies (at 815) a modification to the feature in the current pretabulated environment. In some embodiments, method creates and applies a modification using techniques well known in the art.

A simulation is then performed (at 820) on the current pretabulated environment which contains the modification to the feature. The simulation can be performed, for example, by a simulator that receives as input the current pretabulated environment and produces a current simulated environment. The current simulated environment is a prediction of how the current pretabulated environment (which contains the modification to the feature) will appear once fabricated on a wafer. In some embodiments, the simulator assumes no processing variations (i.e., assumes "normal" processing conditions).

The method then determines (at 825) whether the results of the simulation are satisfactory, i.e., whether the current simulated environment contains a simulated feature that is within a predetermined threshold of variance in appearance from the pretabulated feature contained in the current pretabulated environment. If not, the method proceeds to step 815 where the method creates and applies another modification to the feature in the current pretabulated environment and performs another simulation on the current pretabulated environment (which contains the new modification to the feature). The method iterates steps 815 through 825 until a satisfactory simulated environment is produced.

If the method determines (at 825—Yes) that the results of the simulation are satisfactory, the method then creates (at 830) a model of the current pretabulated environment and stores data of the current pretabulated environment to the model. In some embodiments, the model of the current pretabulated environment is a data structure that stores data describing the current pretabulated environment, wherein the current pretabulated environment contains the last modification made to the feature in the current pretabulated environment (i.e., the modification that produced the satisfactory simulation result).

FIGS. 9A–9F, 10A–10C, and 11A–11C show examples of modifications 925, 1025, and 1125 of features 910, 1010, and 1110 contained in pretabulated environments 905, 1005, and 1105. Note that for the sake of simplicity, the modifications 925, 1025, and 1125 shown in these are four-sided polygons, although in other embodiments, a modification contained a pretabulated environment is of another shape.

The method then determines (at 835) whether the current pretabulated environment is the last pretabulated environment in the set of pretabulated environment. If not, the method proceeds to step 810 where the method selects a next environment in the set of pretabulated environments as a next current pretabulated environment. If so, the method ends.

Figure 12:
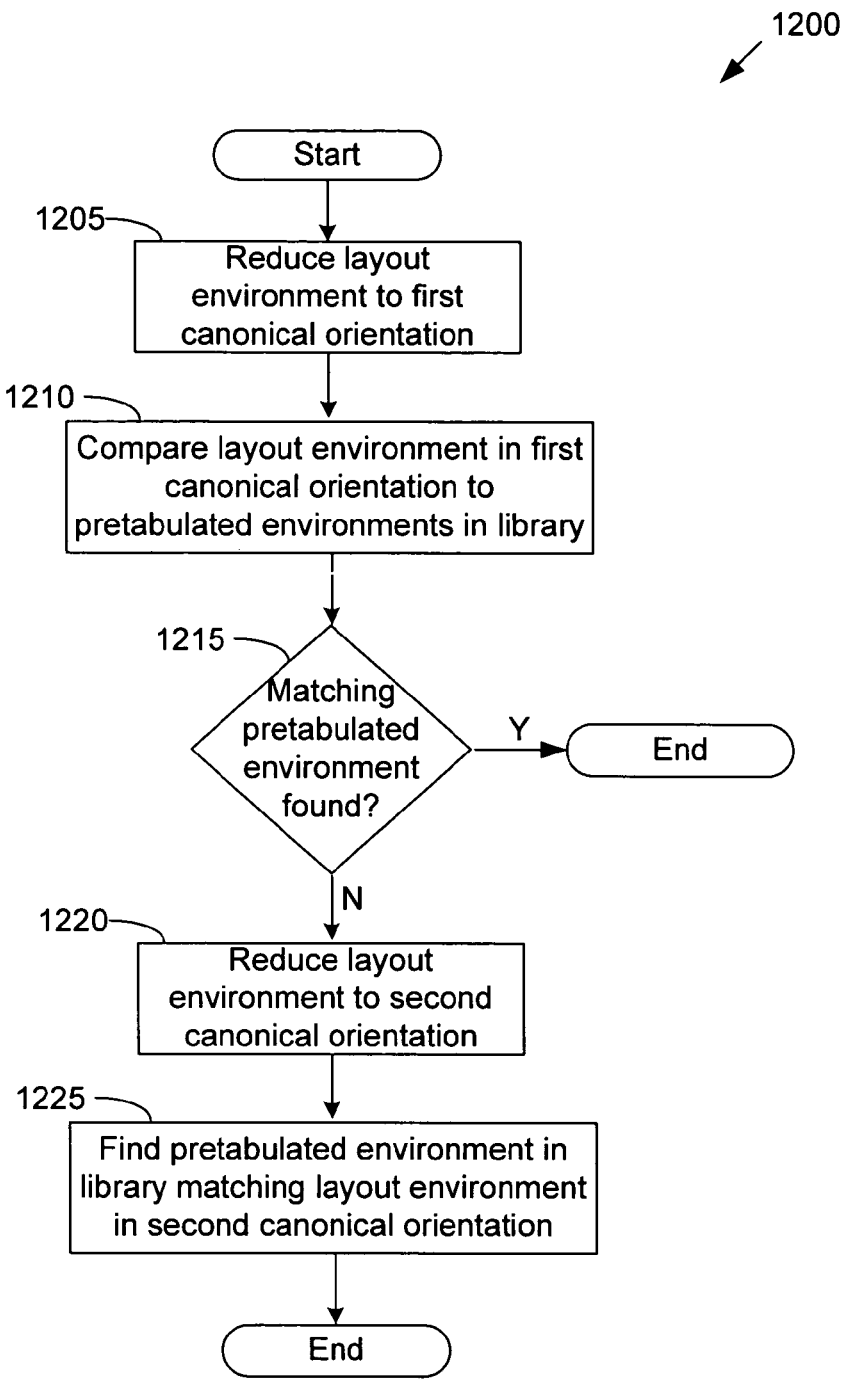
FIG. 12 is a flowchart of a matching method for identifying a model containing a pretabulated environment that matches a layout environment.

Method for Finding a Matching Pretabulated Environment:

As stated above, the layout modification method 700 identifies (at 720) a model containing a pretabulated environment that matches a current layout environment, the model being contained in a library of pretabulated models. FIG. 12 is a flowchart of a matching method 1200 for identifying a model containing a pretabulated environment that matches a layout environment, the model being contained in a library of pretabulated models. FIG. 12 comprises step 720 of the layout modification method 700. FIG. 12 is described in relation to FIGS. 13A–13H.

The method 1200 begins when an environment in a layout is identified (step 715 of FIG. 7), the layout environment containing a feature, a primary geometry on which the specific feature is located, and zero or more neighboring geometries. Note that a single layout environment can have eight different orientations (appearances), wherein the eight orientations are equivalent in the sense that a same modification applied to a feature in each orientation would affect the feature in the same way when the feature is simulated or fabricated. As such, as described herein, a pretabulated environment of a model is determined to "match" a layout environment when it matches any of the layout environment's eight orientations. This is based on the proposition that a modification described in the matching model that is applied to a feature in each orientation produces the same feature when the feature is simulated or fabricated.

Figure 13A:
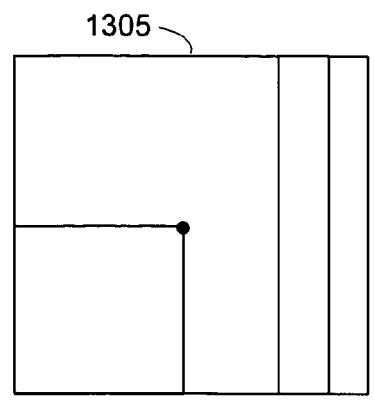
FIGS. 13A–13H illustrate eight different orientations of a layout environment 1305, each orientation being equivalent.
Figure 13B:
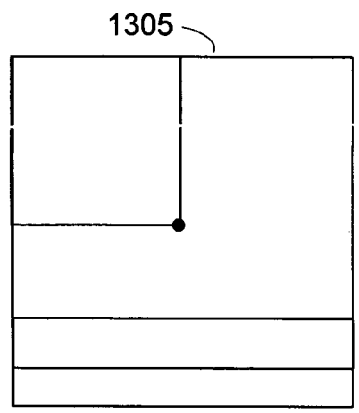
Figure 13C:
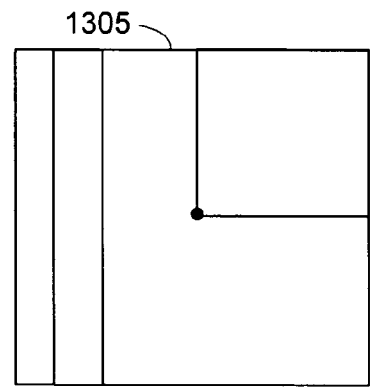
Figure 13D:
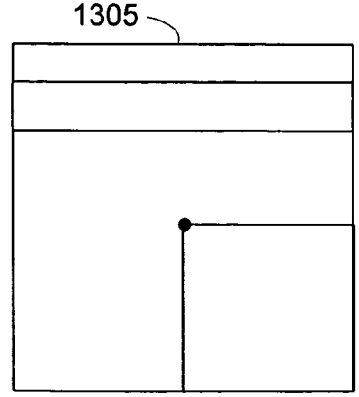
Figure 13E:
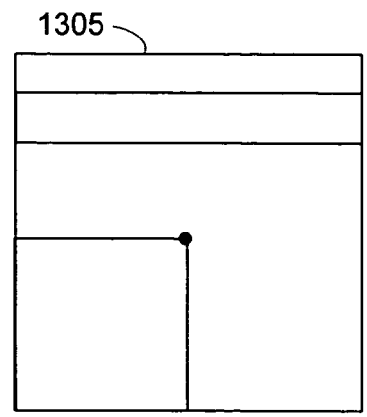
Figure 13F:
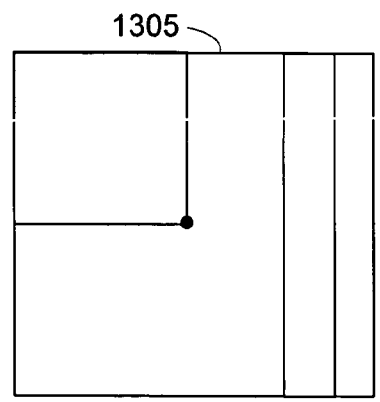
Figure 13G:
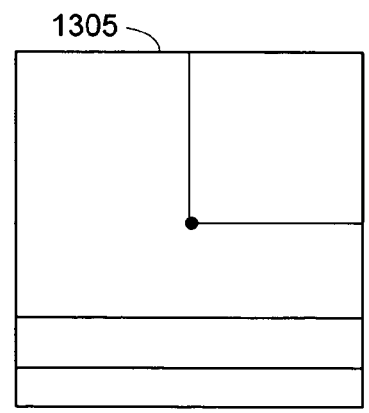
Figure 13H:
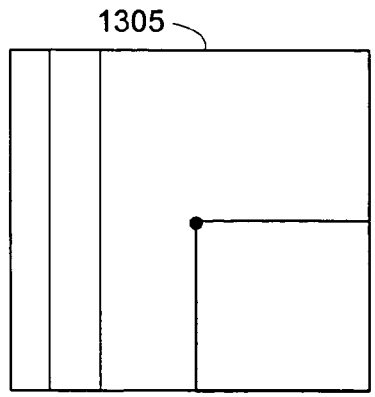

The eight different orientations of a layout environment can be produced through rotating and reflecting a single orientation of the layout environment. FIGS. 13A–13H illustrate eight different orientations of a layout environment 1305, each orientation being equivalent. FIGS. 13B–13D show rotated orientations of the layout environment 1305 shown in FIG. 13A (FIG. 13B shows a 90° clockwise rotation, FIG. 13C shows a 180° clockwise rotation, and FIG. 13D shows a 270° clockwise rotation of the layout environment 1305 shown in FIG. 13A). FIG. 13E shows a reflected orientation of the layout environment 1305 shown in FIG. 13A, a reflected orientation of a layout environment being an orientation that is reflected across a 45° axis of the layout environment (i.e., an interchange of x and y coordinates of the layout environment). FIGS. 13F–13H show rotated orientations of the layout environment 1305 shown in FIG. 13E (FIG. 13F shows a 90° clockwise rotation, FIG. 13G shows a 180° clockwise rotation, and FIG. 13F shows a 270° clockwise rotation of the layout environment 1305 shown in FIG. 13E).

After an environment in a layout is identified the method then reduces (at 1205) the layout environment to a first canonical orientation. In some embodiments, a canonical orientation of a layout environment has a primary geometry (on which a feature of the layout environment is located) located in the lower-left portion of the layout environment. In other embodiments, a different definition of a canonical orientation is used. Note that each layout environment has two canonical orientations since there are two orientations of each layout environment where the primary geometry is located in the lower-left portion of the layout environment. For example, FIGS. 13A and 13E both show canonical orientations of a layout environment 1305. In some embodiments, the first canonical orientation of the layout environment is achieved by rotating the layout environment until the primary geometry is located in the lower-left portion of the layout environment.

The method then compares (at 1210) the layout environment in its first canonical orientation to pretabulated environments in models of the pretabulated library. In some embodiments, the layout environment in its first canonical orientation can be compared to a pretabulated environment, for example, by comparing the dimensions and placements of the primary geometries and any neighboring geometries contained in the layout and pretabulated environments.

In other embodiments, the layout environment in its first canonical orientation is compared to a pretabulated environment using a two step comparison process. In the first step, the layout and pretabulated environments are divided into sub-regions. In some embodiments, the layout and pretabulated environments are divided into 16 sub-regions. The percentage of geometry coverage in each sub-region is then determined for each sub-region of both environments. The percentage of geometry coverage in a sub-region is the area covered by primary and neighboring geometries in the sub-region divided by the total area of the sub-region multiplied by 100.

For each sub-region, a two-bit number reflecting the percentage of geometry coverage in the sub-region is determined. In some embodiments, the two-bit number is set to 00 when the percentage of geometry coverage is equal to 0–25%, set to 01 when the percentage of geometry coverage is equal to 25–50%, set to 10 when the percentage of geometry coverage is equal to 50–75%, and set to 11 when the percentage of geometry coverage is equal to 75–100%. The two-bit numbers for the sub-regions of the layout and pretabulated environments are then combined to produce a combined bit number for each environment. In some embodiments, two-bit numbers for 16 sub-regions of the layout and pretabulated environments are combined to produce a 32 bit number for each environment. If the two combined bit numbers are the same, then, in the second step, the dimensions and placements of the primary geometries and any neighboring geometries contained in the layout and pretabulated environments are compared.

In other embodiments, other methods of calculating a hash function may be used. In other embodiments, the layout and pretabulated environments are divided into a number of sub-regions other than 16 sub-regions. In some embodiments, the combined bit number for each environment is other than a 32 bit number.

The method then determines (at 1215) if a model having a pretabulated environment matching the layout environment has been found in the pretabulated library. If so, the method ends, whereby the layout modification method 700 then retrieves (at 725) data describing a pretabulated modification from the matching model. If not, the method then reduces (at 1220) the layout environment to a second canonical orientation. In some embodiments, the second canonical orientation of the layout environment is achieved by reflecting the first canonical orientation across a 45° axis of the first canonical orientation (i.e., by interchanging the x and y coordinates of the first canonical orientation).

The method then finds (at 1225) a model, in the pretabulated library, having a pretabulated environment matching the layout environment in its second canonical orientation. In some embodiments, the matching pretabulated environment is found by comparing the dimensions and placements of the primary geometries and any neighboring geometries contained in the layout and pretabulated environments. In other embodiments, the matching pretabulated environment is found by comparing the layout and pretabulated environments using the two step comparison process described above. The method then ends, whereby the layout modification method 700 then retrieves (at 725) data describing a pretabulated modification from the matching model.

Note that in the matching method 1200 described above, each model in the library contains a pretabulated environment that can be matched to any of eight equivalent orientations that can be encountered in the layout, the eight different orientations being matched to the pretabulated environment through the rotating and reflecting processes of the matching method 1200. As such, the rotating and reflecting processes of the matching method 1200 allows for the storage of only one pretabulated environment in the pretabulated library for any of eight equivalent orientations encountered in the layout, thus reducing the storage space required to store the pretabulated library.

In the embodiments described above, a single layout environment can have 8 different orientations (appearances). In other embodiments, a single layout environment can have 2, 4, or 16 different orientations, depending on the symmetry of the light source used in the photomasking process and whether 45 degree and 0 degree libraries can be combined. For example, if the light source is completely symmetrical, a single layout environment can have 16 different orientations.

In the embodiments discussed in Section II, it is assumed that a model having a pretabulated environment matching the layout environment is found. Other embodiments, discussed below in Section III, consider the case where no matching model is found in the library.

Figure 14:
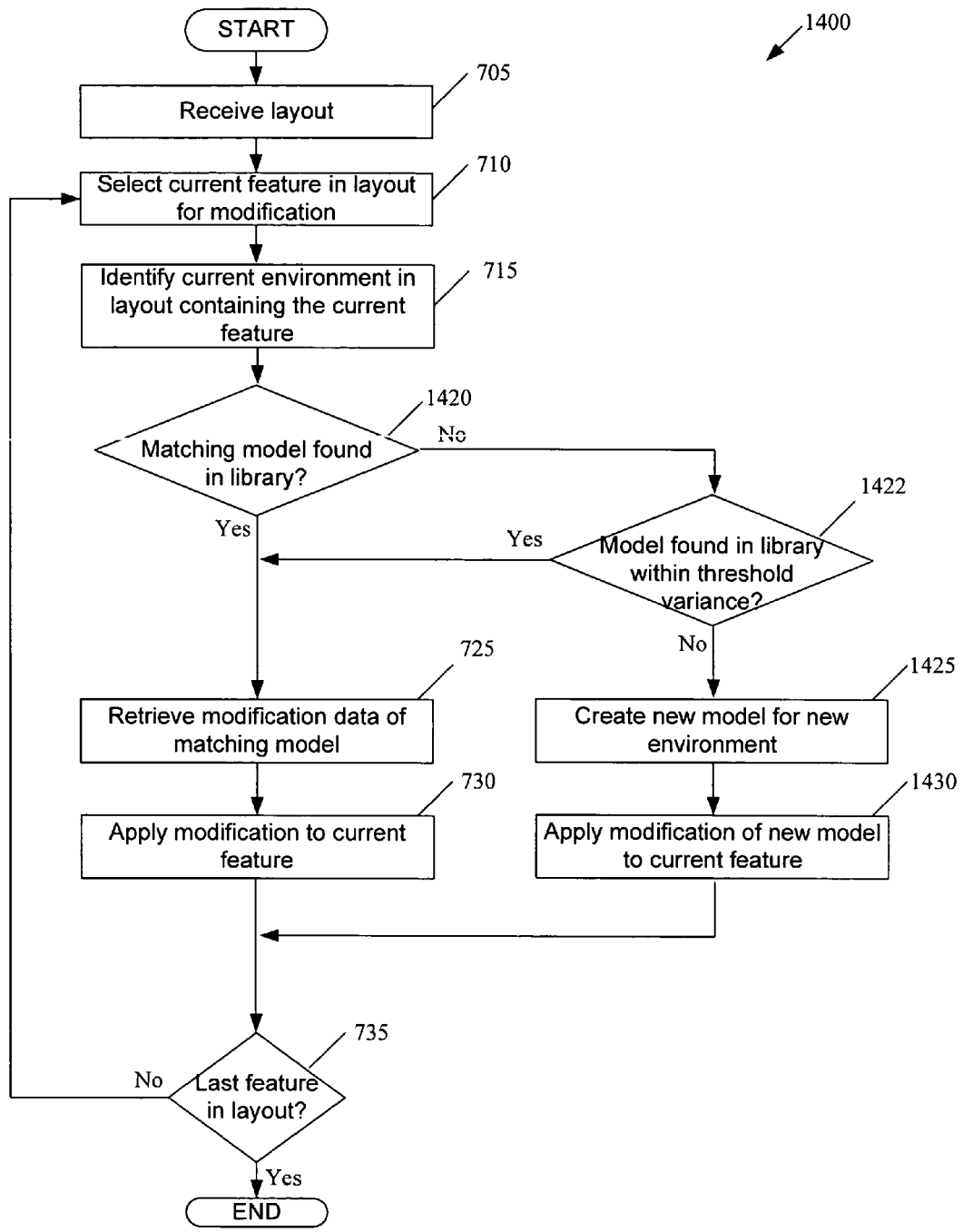
FIG. 14 is a flowchart of an alternative layout modification method for modifying geometries in an IC layout using a library of pretabulated models.

Section III: Alternative Methods of Modifying Geometries in an IC Layout Using the Library of Pretabulated Models FIG. 14 is a flowchart of an alternative layout modification method 1400 for modifying geometries in an IC layout using a library of pretabulated models. The alternative method 1400 comprises step 310 of the general design method 300 (of FIG. 3). As such, the method 1400 receives a design layout and produces a modified layout. The method 1400 can be implemented, for example, by an electronic design automation ("EDA") application that creates, edits, or analyzes IC design layouts. The alternative method 1400 contains several steps that are similar to steps performed in the layout modification method 700 of FIG. 7. Only those steps that differ from the layout modification method 700 are discussed in detail here.

The method 1400 starts when it receives (at 705) an IC design layout having one or more geometries, each geometry containing zero or more features to be modified. The method then selects (at 710) a current feature in the layout for modification. The method then identifies (at 715) a current environment in the layout containing the current feature. The method then determines (at 1420) whether a model having a pretabulated environment that matches the current layout environment is contained in a library of pretabulated models. This can be determined, for example, using the matching method 1200 (discussed above in relation to FIG. 12) for identifying a matching model.

If a matching model is found, the method 1400 then retrieves (at 725), from the matching model, data describing a pretabulated modification and applies (at 730) the pretabulated modification to the current feature. In some embodiments, the matching model also contains other data of the pretabulated environment, such as simulated environment data, re-simulated environment data, electrical characteristic data, and/or an adjustment equation or function data (as described in Section IV). In these embodiments, the method retrieves (at 725), any or all of the other types of data contained in the matching model.

If a matching model is not found (at 1420—No), the method 1400 then determines (at 1422) whether a model having a pretabulated environment that is within a predetermined variance threshold from the current layout environment is contained in the library of pretabulated models. To make this determination, the method determines, for example, whether the dimensions and locations of the geometries of the current layout environment are within a predetermined variance from the dimensions and locations of the geometries of a pretabulated environment in the library. If so, the model having the pretabulated environment that is within the predetermined variance threshold is considered a "matching" model and the method 1400 continues at step 725 where it retrieves, from the "matching" model, data describing a pretabulated modification and applies (at 730) the pretabulated modification to the current feature.

If the method 1400 determines (at 1422—No) that a model having a pretabulated environment that is within a predetermined variance threshold from the current layout environment is not contained in the library, the current layout environment is considered a "new" environment and the method proceeds to step 1425. At step 1425, the method creates a new model for the "new" environment and the current feature by performing, for example, steps 815 to 830 of the library building method 800 of FIG. 8. The new model is stored to the library that contains a pretabulated environment that replicates the "new" environment and a pretabulated modification for a pretabulated feature that replicates the current feature. The method then applies (at 1430) the pretabulated modification to the current feature in the design layout.

The method then determines (at 735) if the current feature is the last feature on the design layout. If so, the method ends. If not, the method proceeds to step 710 where a next current feature in the layout is selected for processing.

In an alternative embodiment, after a matching model is determined (at 1420—No) not to be contained in the library, the method 14 does not perform step 1422, but rather, creates (at 1425) a new model for the "new" environment directly after this determination. In an alternative embodiment, after a matching model is determined (at 1420—No) not to be contained in the library, the method 14 does not perform steps 1422, 1425, and 1430, but rather, uses a conventional rule-based approach to determine a modification to the current feature in the layout. In an alternative embodiment, after a "matching" model is determined (at 1422—No) not to be contained in the library, the method 14 does not perform steps 1425 and 1430, but rather, uses a conventional rule-based approach to determine a modification to the current feature in the layout.

In a further embodiment, the method 1400 is performed without a prior pretabulated library being created. In this embodiment, the method 1400 simultaneously creates a pretabulated library (by creating models for the pretabulated library at step 1425) while modifying features in a layout. As such, the method 1400 creates a pretabulated library "on-the-fly" during runtime when it is used to modify a layout. The models of the pretabulated library created during runtime would typically be stored to a cache having relatively faster read and write times. In this embodiment, the method would determine (at 1420 and 1422) whether a matching or "matching" model is contained in the library, the library containing only models having pretabulated environments that replicate environments that have previously been encountered/identified in the layout during the layout modification process. If a matching or "matching" model is not found, a new model for the new environment would then be created (at 1425).

Section IV: Alternative Data Stored in a Model of the Library

As described in Section II, a model in the library contains data describing a pretabulated environment containing a feature, a modification to the feature, a primary geometry on which the feature is located, and zero or more neighboring geometries. In some embodiments, a model in the library is a data structure that stores data describing a pretabulated environment (for example, in terms of dimensions and placement of objects in the pretabulated environment). In some embodiments, further data is included in the model such as data describing simulation results and/or re-simulation results.

Figure 15:
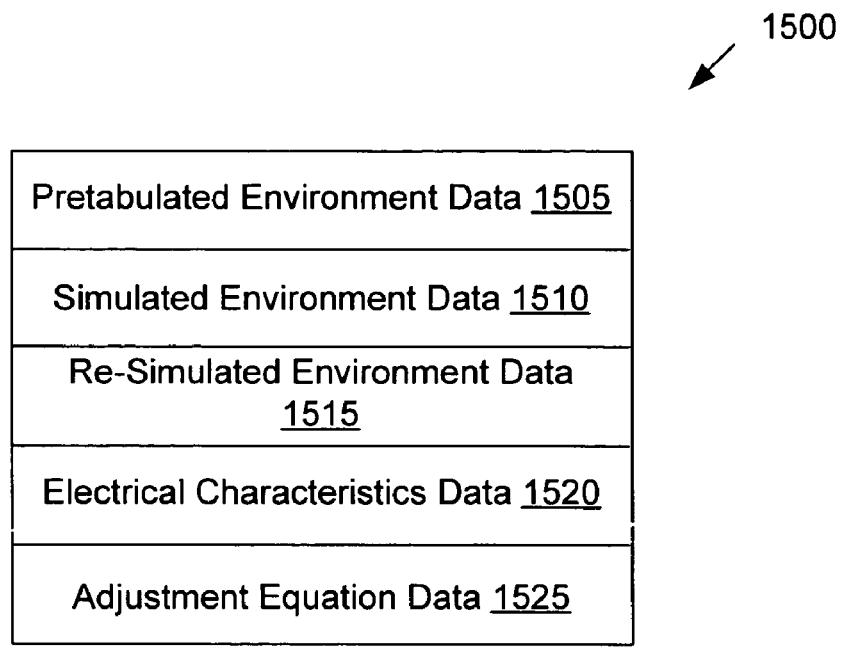
FIG. 15 shows a conceptual diagram of data that is stored in a model of the pretabulated library.

FIG. 15 shows a conceptual diagram of data that is stored in a model 1500 of the pretabulated library. As shown in FIG. 15, the model 1500 contains pretabulated environment data 1505 describing a pretabulated environment containing a feature, a modification to the feature, a primary geometry, and zero or more neighboring geometries.

In some embodiments, the model 1500 also contains simulated environment data 1510 describing a simulated environment that is a prediction of how the pretabulated environment will appear once fabricated on a wafer assuming no processing variations. In some embodiments, the model 1500 also contains re-simulated environment data 1515 describing a re-simulated environment that is a prediction of how the pretabulated environment will appear once fabricated on a wafer assuming one or processing variations. In some embodiments, the model 1500 also contains electrical characteristic data 1520 describing an electrical characteristic of the pretabulated environment. In some embodiments, the model 1500 also contains adjustment equation or function data 1525 describing an adjustment equation or function that uses geometry coverage percentages of particular areas in a design layout to determine an adjustment to a pretabulated modification in the model (as described below in Section V). In some embodiments, the model 1500 contains any or all of the various types of data 1505, 1510, 1515, 1520, and 1525. By storing such data in each model, the various types of data 1505, 1510, 1515, 1520, and 1525 are readily available for use by design engineers (e.g., to determine how the pretabulated environment is predicted to appear once fabricated, the electrical characteristics of the pretabulated environment, etc.) without having to perform further time-costly operations to derive the various types of data.

Simulated Environment and Re-Simulated Environment Data

As an example of how the first three types of data would differ, the pretabulated environment data 1505 would contain data describing a modification to an environment, whereas the simulated environment data 1510 and re-simulated environment data 1515 would contain data describing how the environment will most likely appear when fabricated after the modification is applied, wherein the re-simulated environment data 1515 would reflect one or more process variations and the simulated environment data 1510 would not. As such, a model containing simulated environment data 1510 and/or re-simulated environment data 1515 can provide a design engineer not only a description of a modification to be applied to an environment, but also data describing prediction(s) of how the environment (with the modification applied) will actually appear when fabricated. This simulation data can thus be readily available without having to perform a further time-costly simulation or re-simulation on the model environment.

Figure 16:
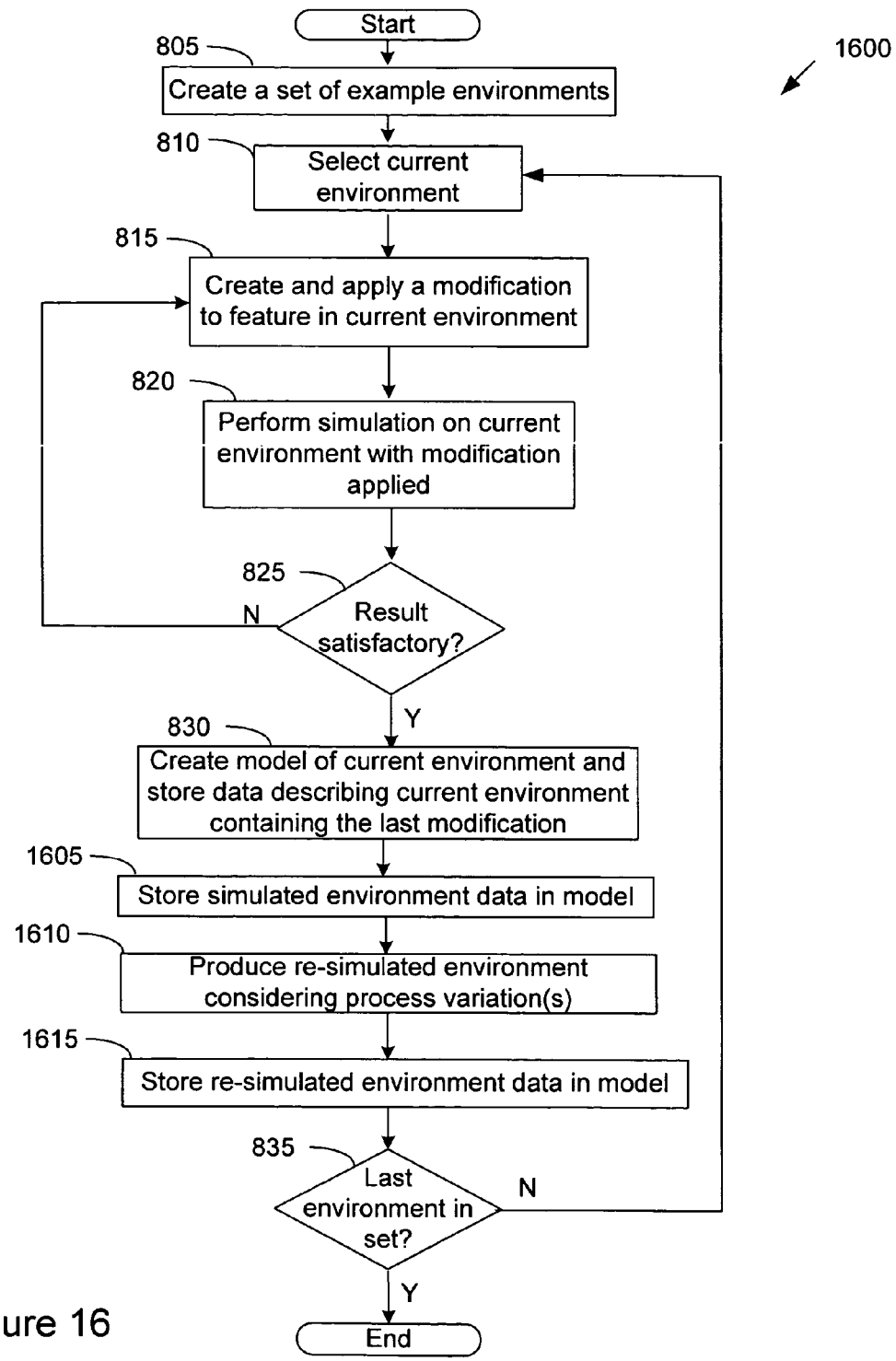
FIG. 16 is a flow chart of an alternative library building method for building a pretabulated library of models, each model containing simulated environment data and/or re-simulated environment data.

The simulated environment data 1510 and the re-simulated environment data 1515 for a model 1500 can be generated and stored through a modification of the library building process 800 of FIG. 8. FIG. 16 is a flow chart of an alternative library building method 1600 for building a pretabulated library of models, each model containing simulated environment data and/or re-simulated environment data. The method 1600 of FIG. 16 is identical to the library building process 800 up to step 830 of the process 800.

At step 830 of the process 800, pretabulated environment data is stored to a model after iterations of modifications and simulations produce (at steps 815 to 825) a satisfactory simulated environment. The simulations are performed (at 820) on a current pretabulated environment (which contains a modification to a feature) by a simulator that assumes no processing variations (i.e., assumes "normal" processing conditions).

After step 830, the method 1600 then stores (at 1605) data describing the satisfactory simulated environment (simulated environment data) to the model. Recall that the satisfactory simulated environment is the simulation result of the pretabulated environment containing the last modification made to the feature in the pretabulated environment.

The method then produces (at 1615) a re-simulated environment of the current pretabulated environment (which contains the last modification to the feature and which produced a satisfactory simulated environment) using a simulator program that takes into consideration one or more process variations. In some embodiments, in producing the re-simulated environment, the simulator program considers a specific process variation (e.g., lens defocus or light dosage) having a specific value.

In other embodiments, a set of two or more re-simulated environments are produced (at 1610) for a single pretabulated environment, the set of two or more re-simulated environments reflecting a set of values for a specific process variation. In these embodiments, a plurality of re-simulated environments are produced for a single pretabulated environment, wherein each re-simulated environment is produced by a simulator that considers a range of different values for a specific process variation. For example, a re-simulated environment may be produced to reflect each defocus value of −6, −3, +3, +6, thereby resulting in a total of four re-simulated environments for a single pretabulated environment.

The re-simulated environment is a prediction of how the modified environment will appear once fabricated on a wafer but is produced by a simulator program that assumes one or more processing variations, such as variations in lens focus or light exposure (light dosage) during the photomasking process. As such, in comparison to the simulated environment (produced at 820), the re-simulated environment reflects one or more processing variations and may vary significantly in appearance from the simulated environment. For example, geometries in the re-simulated environment may be thinner, thicker, or be shaped differently than corresponding geometries in the simulated environment.

The method then stores (at 1615) data describing the re-simulated environment (re-simulated environment data) to the model. In some embodiments, data relating to any specific process variations and any specific values of the process variations reflected by the re-simulated environment (i.e., considered by the simulator producing the re-simulated environment) is also stored to the model.

In the embodiments where a plurality of re-simulated environments are produced for a single pretabulated environment, the plurality of re-simulated environments is stored to the model. For each re-simulated environment in the plurality of re-simulated environments, data relating to any specific process variations and any specific values of the process variations reflected by the re-simulated environment is associated with the re-simulated environment and stored to the model. For example, where a particular re-simulated environment reflects a defocus value of +6, data indicating a defocus value of +6 is associated with the particular re-simulated environment and stored to the model. In other embodiments, a separate model is created for each re-simulated environment in the plurality of re-simulated environments, the model storing data describing the re-simulated environment and data relating to any specific process variations and any specific values of the process variations reflected by the re-simulated environment.

In some embodiments, the method 1600 performs only step 1605 and not steps 1610 and 1615 so that only simulated environment data is stored to the model. In other embodiments, the method 1600 performs only steps 1610 and 1615 and not step 1605 so that only re-simulated environment data is stored to the model.

Electrical Characteristic Data Introduction

In some embodiments, the model 1500 also contains electrical characteristic data 1520 describing one or more electrical characteristics of the pretabulated environment In some embodiments, model 1500 contains an equation (characteristic equation) relating to a specific electrical characteristic of the pretabulated environment. In some embodiments, the characteristic equation expresses a specific electrical characteristic of the pretabulated environment as a function of dimensions and placement of one or more geometries in the pretabulated environment and/or as a function of one or more process variations.

In the embodiments described below, the characteristic equation relates to a capacitance characteristic of the environment, although, in other embodiments, the characteristic equation relates to another electrical characteristic of the environment, such as inductance or resistance. Also, in the embodiments described below, the process variations of lens defocus and light dosage are considered, although, in other embodiments, other process variations are considered.

In some embodiments, the pretabulated environment contains two or more geometries and the characteristic equation (capacitance equation) relates to the capacitance between two geometries in the environment. In some embodiments, the capacitance equation describes the capacitance between two geometries in the pretabulated environment as a function of the distance between the two geometries and one or more process variations (such as lens defocus or light dosage). As discussed in relation to FIGS. 3 and 16, a re-simulated environment that reflects one or more processing variations may vary significantly in appearance from a simulated environment that does not take into account any processing variations. For example, geometries in the re-simulated environment may be thinner, thicker, or be shaped differently than corresponding geometries in the simulated environment. When neighboring geometries in an environment become thinner or thicker, the distance between the neighboring geometries changes and hence the capacitance between the neighboring geometries changes.

Figure 17A:
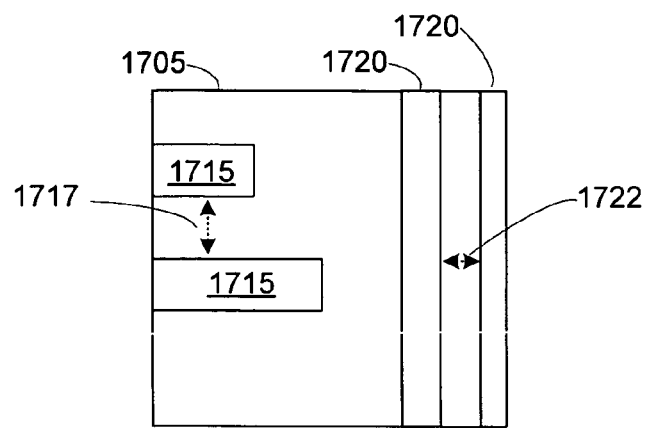
FIG. 17A shows a simulation result of the pretabulated environment that does not reflect any process variations.
Figure 17B:
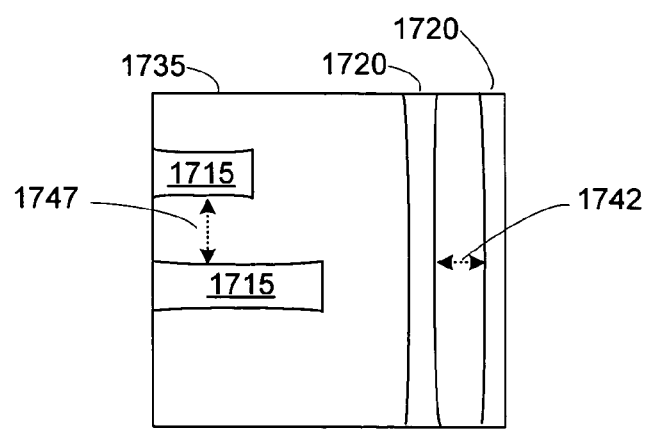
FIG. 17B shows a simulation result of the same pretabulated environment of FIG. 17A taking into consideration one or more process variations.

FIGS. 17A and 17B show simulation results of a same pretabulated environment containing a first pair of neighboring geometries 1715 and a second pair of neighboring geometries 1720. Nearby geometries in an environment can produce interaction (capacitance) between the geometries, the amount of interaction being affected by the distance between the neighboring geometries. FIG. 17A shows a simulation result 1705 of the pretabulated environment that does not reflect any process variations. As shown in FIG. 17A, there is a first distance 1717 between the first pair of geometries 1715 and a second distance 1722 between the second pair of geometries 1720. A capacitance between the first pair of geometries 1715 is determined in large part by the first distance 1717 between the geometries 1715 and a capacitance between the second pair of geometries 1720 is determined in large part by the second distance 1722 between the geometries 1720.

FIG. 17B shows a simulation result 1735 of the same pretabulated environment of FIG. 17A taking into consideration one or more process variations (such as lens defocus or light dosage). FIG. 17B shows a simulated environment 1735 that is changed from the simulated environment 1705 shown in FIG. 17A. Specifically, as shown in FIG. 17B, there is a third distance 1747 between the first pair of geometries 1715 that is different than the a first distance 1717 shown in FIG. 17A. Also, there is a fourth distance 1742 between the second pair of geometries 1720 that is different than the second distance 1722 shown in FIG. 17A. These changes in distances between the first and second pair of neighboring geometries results from the one or more process variations reflected by the simulation result 1735 of FIG. 17B.

In some embodiments, the capacitance (C) between two geometries in a changed environment that has been changed from an initial environment is expressed by a first capacitance equation:

$$C = C_0 + k_1 \Delta W$$

By using the first capacitance equation, the capacitance between two geometries in an environment can be calculated given a change in distance ($\Delta W$) between two geometries. However, the first capacitance equation does not express capacitance as a function of process variations (which are the causes of the change in distance($\Delta W$)).

Since the capacitance between neighboring geometries is affected by the distance between the geometries, and one or more process variations affect the distance between the geometries (since process variations can cause geometries to become thinner or thicker), the capacitance between neighboring geometries can be seen a function of the distance between the geometries and one or more process variations. In some embodiments, the capacitance (C) between two geometries in a changed environment that has been changed from an initial environment due to one or more process variations (PV) is expressed by a second capacitance equation:

$$C = C_0 + k_1 \Delta W + k_2 \Delta PV_1 + \ldots$$

where $C_0$ is a capacitance (initial capacitance) of the initial environment that reflects no process variations (i.e., where $\Delta W$, $\Delta PV_1$, etc. all equal zero), $k_1$, $k_2$, etc. are predetermined sensitivity coefficients, $\Delta W$ is the difference in distance between the two geometries from the initial environment to a changed environment, and $\Delta PV_1$ is the difference in values of a specific process variation reflected in the initial environment and the changed environment. For example, $\Delta W$ may be equal to the distance between the two geometries in the changed environment minus the distance between the two geometries in the initial environment. Also, $\Delta PV_1$ may be equal to the value of a specific process variation reflected in the changed environment minus the value of the specific process variation reflected in the initial environment (which, in some embodiments, is always equal to zero). In some embodiments, the value of $C_0$ (initial capacitance) is adjusted/shifted or set to a predetermined value to correct or minimize error in the capacitance equation.

In some embodiments, the capacitance (C) between two geometries in a changed environment that has been changed due to the process variations of lens defocus and light dosage is expressed by an example of the second capacitance equation in the form:

$$C = C_0 + k_1 \Delta W + k_2 \Delta DF + k_3 \Delta dosage$$

where $k_1$, $k_2$, and $k_2$, are predetermined sensitivity coefficients, $\Delta DF$ is the difference in defocus values reflected in the initial environment and the changed environment and $\Delta dosage$ is the difference in light dosage values reflected in the initial environment and the changed environment.

Method for Storing Electrical Characteristic Data to a Model

The interaction (capacitance) between geometries in an environment is an important electrical characteristic of the environment that should be taken into account when designing IC layouts. As such, having data describing the capacitance characteristics of an environment readily available, without need for further calculations, would be highly advantageous. In some embodiments, a capacitance equation describing the capacitance characteristics of an environment is stored to a model containing the environment, the model being contained in a pretabulated library of models. In some embodiments, the capacitance equation expresses capacitance between two geometries in the environment as a function of a change in distance between the two geometries. In some embodiments, the capacitance equation expresses capacitance as a function of a change in distance between the two geometries and one or more process variations.

The library building method 800 of FIG. 8 can be modified to build a library of pretabulated models where each model contains a pretabulated environment and a predetermined capacitance equation describing capacitance characteristics of the pretabulated environment. In some embodiments, the capacitance equation is in the form $C = C_0 + k_1 \Delta W$ where the value for $C_0$ and the coefficient $k_1$ are predetermined. In some embodiments, the capacitance equation is in the form $C = C_0 + k_1 \Delta W + k_2 \Delta DF + k_3 \Delta dosage$, where the value for $C_0$ and coefficients $k_1$, $k_2$, and $k_3$ are predetermined.

Figure 18:
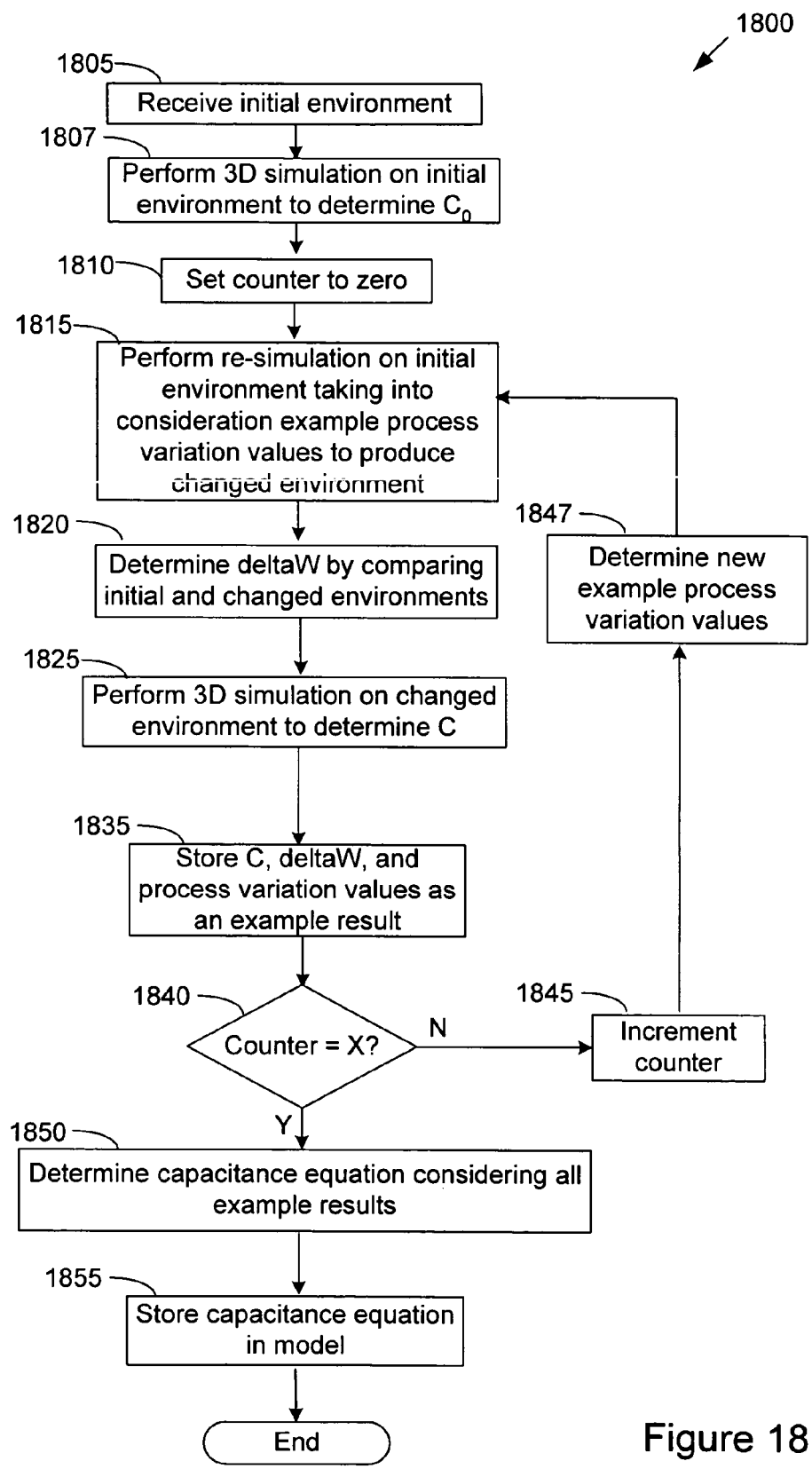
FIG. 18 is a flowchart of an alternative library building method for producing a library containing predetermined capacitance equations.

Specifically, after step 830 of the library building method 800, an alternative library building method 1800 (shown as a flowchart in FIG. 18) can be performed to produce a library containing predetermined capacitance equations. After step 825 of the library building method 800, a current environment that produces a satisfactory simulated environment is achieved, the satisfactory simulated environment being referred to as an initial environment. A model is then created which stores (at step 830 of the library building method 800) data describing the current environment.

The alternative library building method 1800 begins when it receives (at 1805) the initial environment. An example of an initial environment is shown in FIG. 17A. In some embodiments, the initial environment contains at least one pair of neighboring geometries with a particular distance between them. In some embodiments, the initial environment contains two or more pairs of neighboring geometries, each with a particular distance between them.

The method then performs (at 1807) a three-dimensional electromagnetic simulation (3D simulation) on the initial environment to find an initial capacitance ($C_0$) between one pair of neighboring geometries in the initial environment. In some embodiments, the method performs a 3D simulation on the initial environment to find initial capacitances between two or more pairs of neighboring geometries in the initial environment. In some embodiments, the 3D simulation is performed by a three-dimensional electromagnetic simulator program that solves Maxwell equations, as is well known in the art. In some embodiments, another type of simulation is performed to determine the initial capacitance ($C_0$).

A counter is then set (at 1810) to zero, the counter being used to count the number of iterations of the method and to stop the iterations once a predetermined number of X iterations are completed.

A re-simulation is then performed (at 1815) on the current environment to produce a changed environment, the re-simulation taking into consideration example process variation values of defocus and dosage. An example of a changed initial nvironment is shown in FIG. 17B. In some embodiments, the re-simulation is performed by a simulator that takes into consideration specific example values of lens defocus and light dosage.

In the changed environment, the pair of neighboring geometries will be different in appearance than from the initial environment (e.g., they will appear thinner, thicker, or different in shape). As such, a distance between the pair of neighboring geometries in the changed environment will most likely be different than the distance between the pair of neighboring geometries in the initial environment. In some embodiments, the initial and changed environments contain two or more pairs of neighboring geometries, each distance between the two or more pairs of geometries being changed from the initial environment to the changed environment.

The method then determines (at 1820) a difference ($\Delta W$) between the distances of the pair of neighboring geometries in the changed environment and the initial environment. The difference ($\Delta W$) is determined by comparing the pair of neighboring geometries in the changed environment and the initial environment. For example, $\Delta W$ may be equal to the distance between the pair of geometries in the changed environment minus the distance between the pair of geometries in the initial environment. In some embodiments, the method determines a difference ($\Delta W$) between the distances of two or more pairs of neighboring geometries in the changed environment and the initial environment.

The method then performs (at 1825) a 3D or other simulation on the changed environment to find a capacitance value (C) between the pair of neighboring geometries in the changed environment. In some embodiments, the method performs a 3D or other simulation on the changed environment to find a capacitance for each of two or more pairs of neighboring geometries in the changed environment.

The method then stores (at 1835) the capacitance value (C) (determined at step 1825), the difference ($\Delta W$) in distances (determined at step 1820), and specific values for lens defocus and light dosage (used in the re-simulation at step 1815) as an example result for the pair of neighboring geometries. In some embodiments, the method stores capacitance values (Cs) and specific values for lens defocus and light dosage for two or more pairs of neighboring geometries.

The method then determines (at 1840) if the counter is equal to X. If not, the method increments (at 1845) the counter and determines (at 1847) new example defocus and dosage values. A re-simulation is then performed (at 1815) on the initial environment taking into consideration the new example defocus and dosage values. If the method determines (at 1840—Yes) that the counter is equal to X, the method proceeds to step 1850.

At this point, the method has stored (at 1835) a set of example results (equal to X), each example result having a capacitance (C), distance difference ($\Delta W$), defocus, and dosage value. The set of example results cover a range of capacitance (C), distance difference ($\Delta W$), defocus, and dosage values. Using this data, the method then determines (at 1850) a capacitance equation that considers all X example results and expresses capacitance between the pair of geometries as a function of distance difference ($\Delta W$), defocus, and dosage. In some embodiments, the method determines a capacitance equation for two or more pairs of geometries. In some embodiments, the capacitance equation is determined automatically, without the need for human intervention. In some embodiments, the method determines the capacitance equation using mathematical modeling methods or computer learning methods (discussed below in Section V).

In some embodiments, the capacitance equation in the form:

$$C=C_0+k_1\Delta W+k_2\Delta DF+k_3\Delta dosage$$

where $C_0$ is a predetermined capacitance value, $k_1$, $k_2$, and $k_2$, are predetermined sensitivity coefficients, $\Delta DF$ is the difference in defocus values reflected in an initial environment and a changed environment, and $\Delta dosage$ is the difference in light dosage values reflected in the initial environment and the changed environment. Note that since an initial environment is typically a simulated environment that does not reflect any process variations, the initial environment typically reflects defocus and dosage values of zero. As such, in some embodiments, $\Delta DF$ is equal to the defocus value reflected in a changed environment and $\Delta dosage$ is equal to the dosage value reflected in the changed environment.

The method then stores (at 1855) the determined capacitance equation to the model created in step 830 of FIG. 8. In some embodiments, the stores two or more determined capacitance equation to the model. The method then ends.

In an alternative embodiment, the alternative library building method 1800 is performed separately from the library building method 800 of FIG. 14. In this embodiment, the method 1800 receives (at 1805) an initial environment that is a simulated environment produced by other methods, such as conventional layout design methods. The method 1800 receives a set of such simulated environments and produces a set of models in a library, each model containing a predetermined capacitance equation.

By storing a capacitance equation for an environment in a pretabulated library, this reduces the processing time required to later determine the capacitance equation for the environment. The capacitance equation can be used to determine the capacitance between a pair of neighboring geometries in the environment given specific values of lens defocus and light dosage.

Electrical Characteristic Data: Alternative Embodiments

In an alternative embodiment, the method 1800 considers one or more different process variations other than lens defocus and light dosage. In these embodiments, the method 1800 considers one or more different process variations when performing (at 1815) the re-simulation, stores (at 1835) specific values for the one or more different process variations, and determines (at 1850) the capacitance equation considering the one or more different process variations.

In an alternative embodiment, the method 1800 does not determine (at 1850) a capacitance equation, but rather, stores (at 1855) the set of example results determined and stored at steps 1815 through 1847, each example result having a capacitance (C), distance difference ($\Delta W$), defocus, and dosage value.

In an alternative embodiment, the method 1800 stores (at 1835) only values for capacitance and distance difference ($\Delta W$) as an example result, determines (at 1850) a capacitance equation in the form $C=C_0+k_1\Delta W$, and stores (at 1855) the capacitance equation to the model. In some embodiments, the capacitance equation is in a form other than the form $C=C_0+k_1\Delta W$ or $C=C_0+k_1\Delta W+k_2\Delta DF+k_3\Delta dosage$.

In an alternative embodiment, the method 1800 does not perform (at 1815) the re-simulation of the initial environment, but rather, creates a changed environment where the pair of neighboring geometries has a particular distance between them so that the distance difference ($\Delta W$) between the pair of neighboring geometries in the initial and changed environments is equal to a predetermined difference. As such, through multiple iterations, the method 1800 creates a set of changed environments that produce a set of distance differences ($\Delta W$s). The set of distance differences ($\Delta W$s) can be predetermined by design engineers. Also, the method stores (at 1835) only values for capacitance and distance difference ($\Delta W$) as an example result, determines (at 1850) a capacitance equation in the form $C=C_0+k_1\Delta W$, and stores (at 1855) the capacitance equation to the model.

In an alternative embodiment, the method 1800 determines and stores an equation describing an electrical characteristic of an environment other than capacitance. For example, the method 1800 may determine and store an inductance equation describing inductance in the environment or determine and store a resistance equation describing resistance in the environment.

Section V: Modifying a Layout Using the Library of Pretabulated Models in Conjunction With Equation or Function-Based Methods As discussed above, models in the pretabulated library of models contain descriptions of pretabulated environments that are of a predetermined size. To keep the number of pretabulated environments in the library to a manageable number, the predetermined size of the pretabulated environments is kept to a reasonable size (since the larger the predetermined size of the pretabulated environments, the greater the number of pretabulated environments required in the library to cover the greater number of variations in geometry dimensions and placement that can occur).

In the layout modification method 700 for modifying geometries in an IC layout using a library of pretabulated models (discussed above in relation to FIG. 7), the predetermined size of the pretabulated environments in the library determines the size of an environment that is identified on a design layout, the layout environment containing a feature that is to be modified. Geometries lying outside the layout environment, however, also affect how the feature will appear once fabricated, although to a lesser degree than the geometries lying inside the layout environment.

In some embodiments, information relating to geometries (outside geometries) lying outside a layout environment is used to adjust a modification contained in a model (having a pretabulated environment that matches the layout environment) that is to be applied to a feature in the layout environment. In other embodiments, information relating to geometries lying between a first radius distance and a second radius distance from the feature in the layout environment is used to adjust the modification contained in a model. In further embodiments, a modification contained in the model is adjusted according to a predetermined adjustment equation or function that uses geometry coverage percentages of particular areas in the design layout, the adjustment equation or function being contained in the model.

Figure 19:
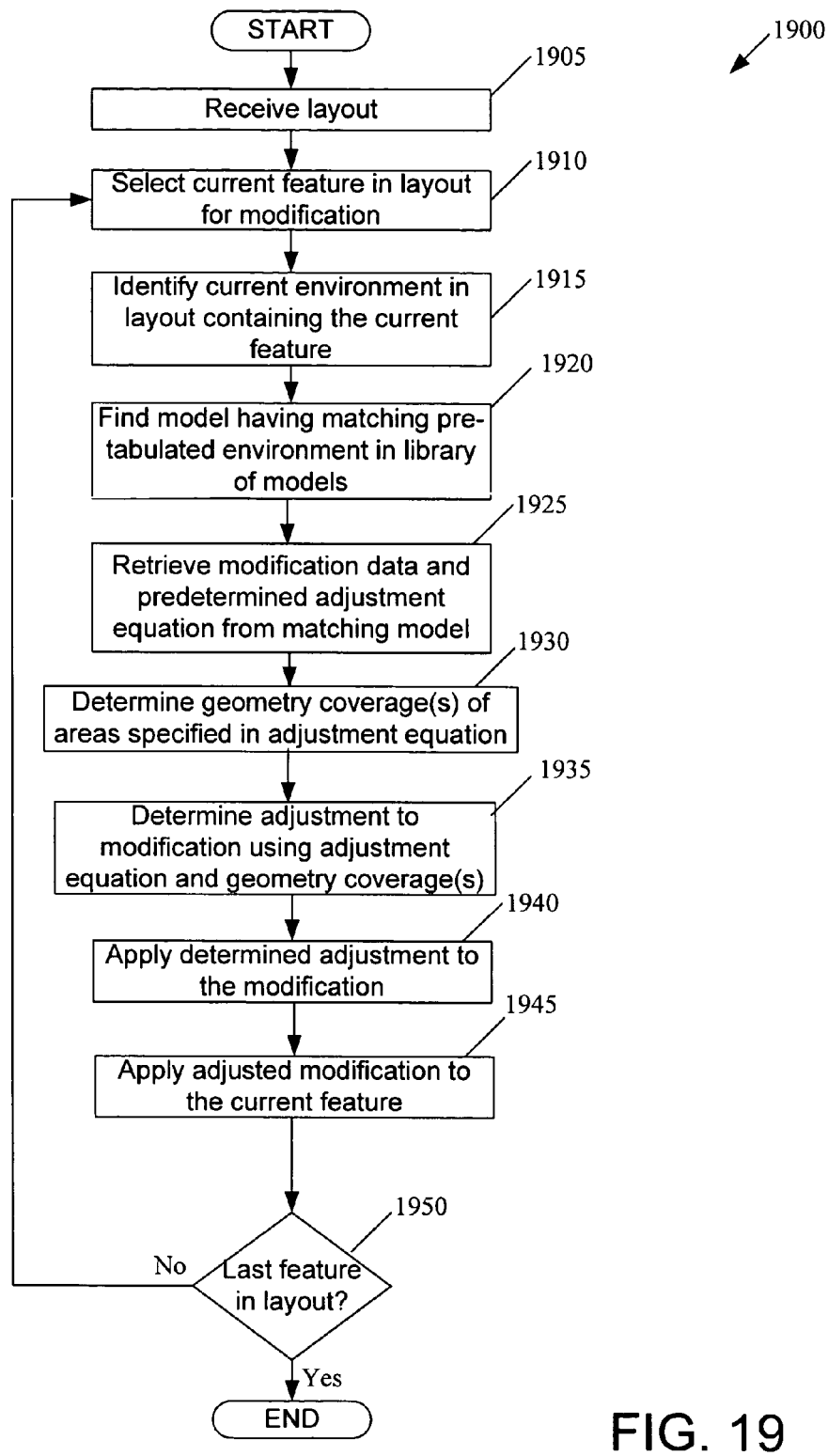
FIG. 19 is a flow chart of an adjustment method for modifying geometries in an IC layout using a library of pretabulated models in conjunction with a predetermined adjustment equation of function.

FIG. 19 is a flow chart of an adjustment method 1900 for modifying geometries in an IC layout using a library of pretabulated models in conjunction with a predetermined adjustment equation or function. Each model in the library contains a modification to be applied to a geometry or feature in the IC layout and a predetermined adjustment equation or function that is used to adjust the modification. The method 1900 can be implemented, for example, by an electronic design automation ("EDA") application that creates, edits, or analyzes IC design layouts. The adjustment method 1900 of FIG. 19 has many similar steps to the layout modification method 700 of FIG. 7 and only those steps that differ are discussed in detail here. FIG. 19 is described in relation to FIG. 20.

The adjustment method 1900 comprises step 310 of the general design method 300 (of FIG. 3). As such, the method 1900 receives a design layout and produces a modified layout. The method 1900 starts when it receives (at 1905) an IC design layout having one or more geometries, each geometry containing zero or more features to be modified. The method then selects (at 1910) a current feature in the layout for modification. The method then identifies (at 1915) a current environment in the layout containing the current feature, the current layout environment having a predetermined size.

Figure 21:
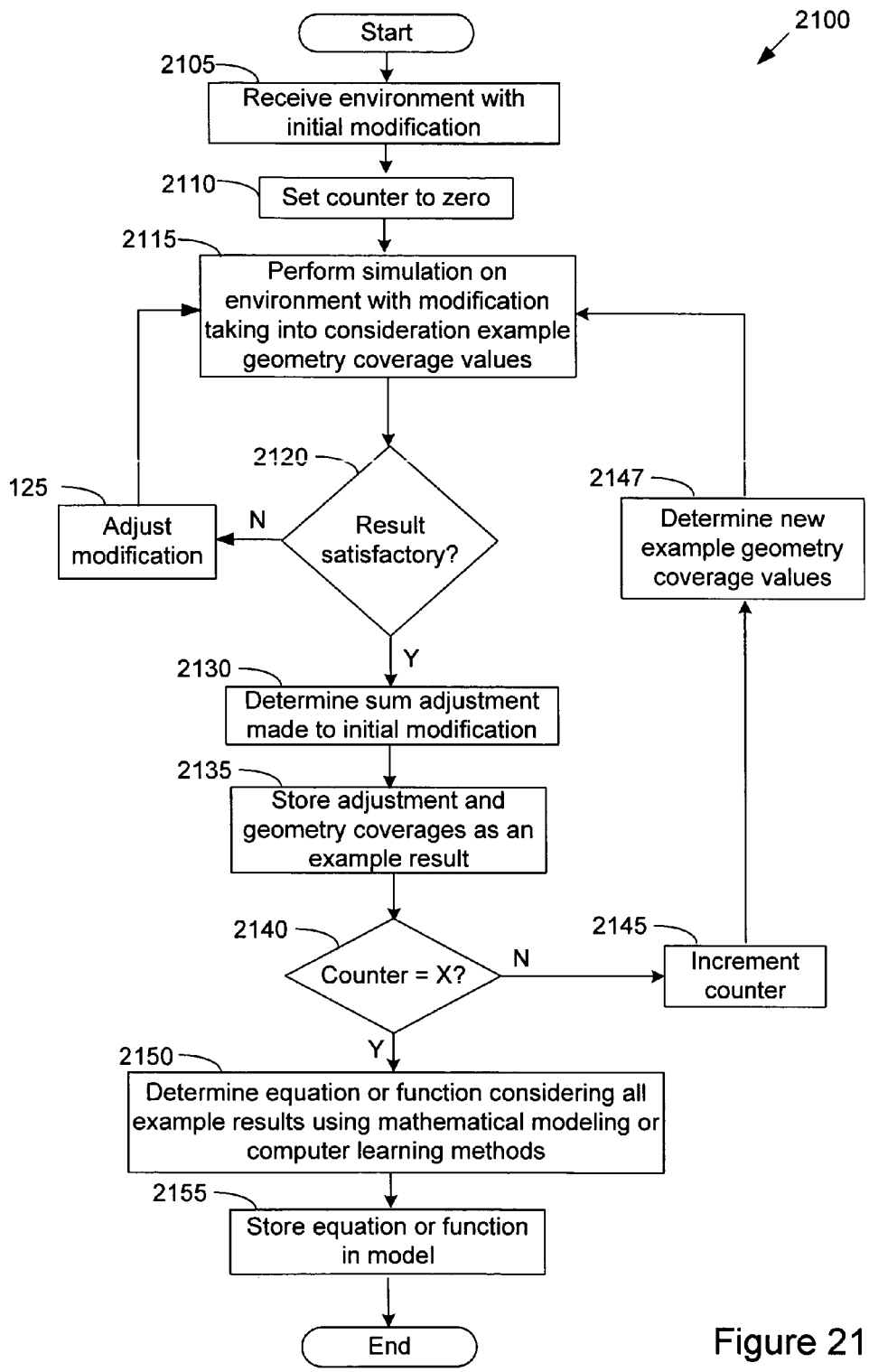
FIG. 21 is a flowchart of an alternative library building method used to produce a library containing predetermined adjustment equations or functions.

The method then identifies (at 1920) a model containing a pretabulated environment that matches the current layout environment, the model being contained in a library of pretabulated models. Each model in the library contains data describing a pretabulated environment which includes a feature, a primary geometry on which the specific feature is located, and zero or more neighboring geometries. Each model in the library also contains data describing a pretabulated modification to the pretabulated feature and a predetermined adjustment equation or function used to adjust the pretabulated modification. A method for building a library of pretabulated models, each model containing a predetermined adjustment equation or function is discussed below in relation to FIG. 21.

The method then retrieves (at 1925), from the matching model, data describing the pretabulated modification and the predetermined adjustment equation or function for adjusting the pretabulated modification. In some embodiments, the matching model also contains other data of the pretabulated environment, such as simulated environment data, re-simulated environment data, and/or electrical characteristic data (as described in Section IV). In these embodiments, the method retrieves (at 1925), any or all of the other types of data contained in the matching model.

In some embodiments, the adjustment equation or function contains one or more predetermined coefficients and one or more variables being geometry coverage percentages of particular areas in the design layout. In some embodiments, the adjustment equation or function is the form:

$$A = k_1 F_1 + k_2 F_2 + \ldots$$

where A is the adjustment to be made to the pretabulated modification, $k_1$, $k_2$, etc. are predetermined coefficients, and $F_1$, $F_2$, etc. are geometry coverage percentages of particular areas in the design layout. In other embodiments, the adjustment equation or function is of a different form.

The method then determines (at 1930) geometry coverage percentages of particular areas in the design layout specified in the adjustment equation or function. In some embodiments, a geometry coverage percentage specified in the adjustment equation or function is of a region in the design layout between an inner predetermined radius distance and an outer predetermined radius distance from the current feature, these regions being referred to as radius regions. The geometry coverage percentage of a radius region is equal to the area covered by geometries in the radius region divided by the total area of the radius region multiplied by 100.

Figure 20:
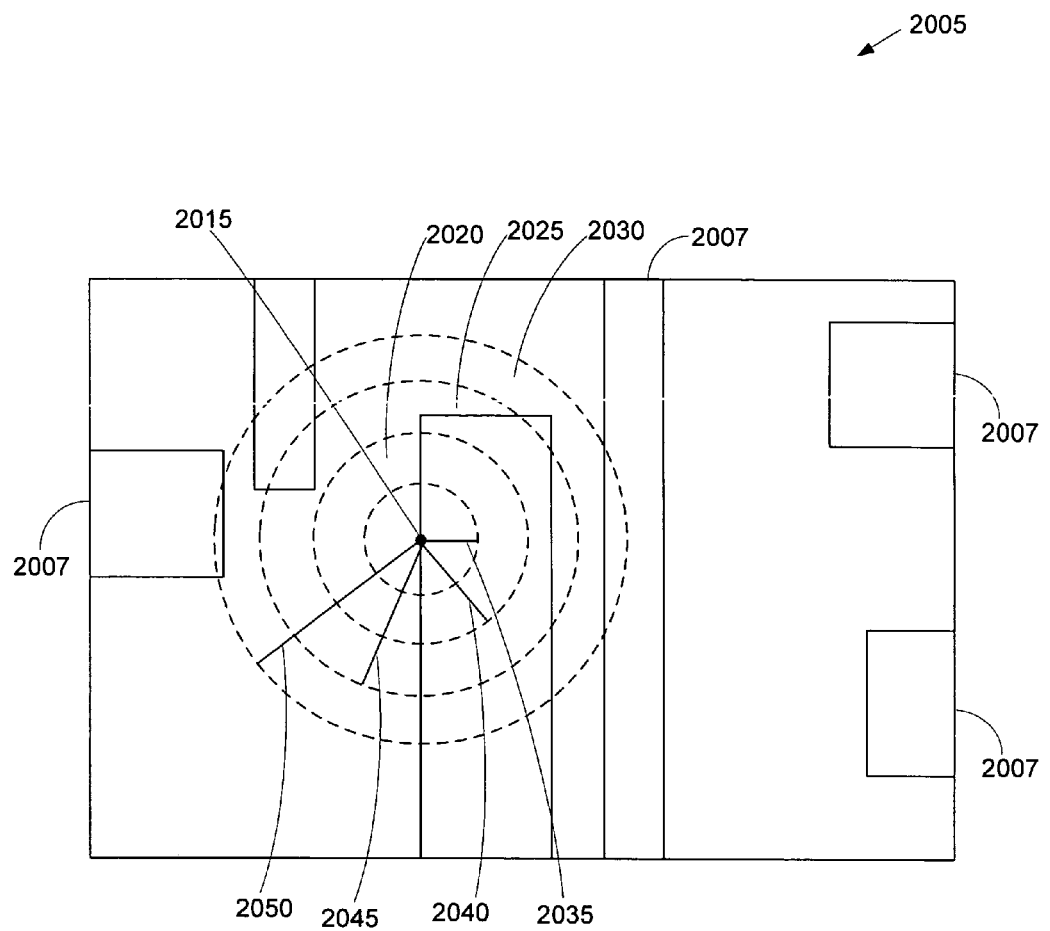
FIG. 20 shows a top-view diagram of a sub-region of a layout containing various geometries, a current feature, and three radius regions surrounding the current feature.

FIG. 20 shows a top-view diagram of a sub-region 2005 of a layout containing various geometries 2007, a current feature 2015, and three radius regions 2020, 2025, and 2030 surrounding the current feature 2015. A first radius region 2020 spans from a first radius distance 2035 to a second radius distance 2040 from the current feature 2015, a second radius region 2025 spans from the second radius distance 2040 to a third radius distance 2045 from the current feature 2015, and a third radius region 2030 spans from the third radius distance 2045 to a fourth radius distance 2050 from the current feature 2015. A geometry coverage percentage can be determined for each radius region 2020, 2025, and 2030.

The method then determines (at 1935) the adjustment to be made to the pretabulated modification using the adjustment equation or function and the geometry coverage percentages specified in the adjustment equation or function. In the example shown in FIG. 20, assume that the predetermined equation is in the form:

$$A = k_1 F_1 + k_2 F_2 + k_3 F_3$$

where A is the adjustment to be made to the pretabulated modification, $k_1$, $k_2$, and $k_3$ are predetermined coefficients, and $F_1$, $F_2$, and $F_3$ are geometry coverage percentages of the first, second, and third radius regions 2020, 2025, and 2030, respectively. After the values for the geometry coverage percentages $F_1$, $F_2$, and $F_3$ are determined, these values are input to the equation to determine the adjustment (A) to be made to the pretabulated modification. The adjustment may be expressed, for example, as a percentage amount that the modification be increased or decreased, or a distance that each side of the modification is to be increased or decreased.

The method then applies (at 1940) the calculated adjustment to the pretabulated modification (for example, by increasing or decreasing the modification by the calculated amount) to produce an adjusted modification. The adjusted modification is then applied (at 1945) to the current feature in the design layout. The method then determines (at 1950) if the current feature is the last feature on the design layout. If so, the method ends. If not, the method proceeds to step 1910 where a next current feature in the layout is selected for processing.

As stated above, the adjustment method 1900 identifies (at 1920) a model containing a pretabulated environment that matches a current layout environment, the model being contained in a library of pretabulated models. Each model in the library contains a pretabulated environment having a pretabulated modification and a predetermined adjustment equation or function used to adjust the pretabulated modification. In some embodiments, the adjustment equation or function contains one or more predetermined coefficients and one or more variables being geometry coverage percentages of particular areas in the design layout.

The library building method 800 of FIG. 8 can be modified to build a library of pretabulated models where each model contains a pretabulated environment having a pretabulated modification and a predetermined adjustment equation or function used to adjust the pretabulated modification. Specifically, after step 830 of the library building method 800, an alternative library building method 2100 (shown as a flowchart in FIG. 21) can be performed to produce a library containing predetermined adjustment equations or functions.

After step 825 of the library building method 800, a current pretabulated environment having a modification to a feature that produces a satisfactory simulated environment is achieved, the modification being referred to as an initial modification. A model is then created which stores (at step 830 of the library building method 800) the current pretabulated environment. The alternative library building method 2100 begins when it receives (at 2105) the current pretabulated environment having the initial modification. A counter is then set (at 2110) to zero, the counter being used to count the number of iterations of the method and to stop the iterations once a predetermined number of X iterations are completed.

A simulation is then performed (at 2115) on the current pretabulated environment which contains a modification to a feature, the simulation taking into consideration one or more example geometry coverage values of particular regions surrounding the feature. In some embodiments, the example geometry coverages are of regions between an inner predetermined radius distance and an outer predetermined radius distance from the feature. For example, three example geometry coverages of three radius regions may be considered in the simulation (see FIG. 20). Through multiple iterations of the method 2100 (as determined by a predetermined iteration number X), the example geometry coverages will vary through a broad range of values. For example, if three example geometry coverages of three radius regions are considered, the geometry coverages may be 5%, 5%, 5% on a first iteration, 5%, 5%, 10% on a second iteration, 5%, 5%, 15% on a third iteration, etc.

The simulation can be performed, for example, by a simulator that receives as input the current pretabulated environment and one or more geometry coverage values to produce a current simulated environment. The current simulated environment is a prediction of how the current pretabulated environment will appear once fabricated on a wafer considering the modification applied to the feature in the current pretabulated environment and the one or more example geometry coverage values.

The method then determines (at 2120) whether the results of the simulation are satisfactory, i.e., whether the simulated environment contains a simulated feature that is within a predetermined threshold of variance in appearance from the pretabulated feature contained in the current pretabulated environment. If not, the method proceeds to step 2125 where the method adjusts the modification to the feature in the current pretabulated environment and performs another simulation on the current pretabulated environment. The method iterates steps 2115 through 2125 until a satisfactory simulated environment is produced, the satisfactory simulated environment being produced by a last modification.

If method determines (at 2120—Yes) that the results of the simulation are satisfactory, the method then determines (at 2130) a sum adjustment made to the initial modification (received at step 2105), the combination of the sum adjustment and initial modification being applied to the pretabulated feature and having produced a satisfactory simulated feature. The sum adjustment can be determined, for example, by comparing the area of the last modification that produced the satisfactory simulation and the area of the initial modification, the difference between the two modifications being the sum adjustment made to the initial modification. In some embodiments, the sum adjustment is expressed as a numerical value, for example, as a percentage amount.

The method then stores (at 2135) the sum adjustment value and the one or more geometry coverage values as an example result. The method then determines (at 2140) if the counter is equal to X. If not, the method increments (at 2145) the counter and determines (at 2147) new example geometry coverage values. A simulation is then performed (at 2115) on the current pretabulated environment taking into consideration the one or more new example geometry coverage values. If the method determines (at 2140—Yes) that the counter is equal to X, the method proceeds to step 2150.

At this point, the method has stored (at 2135) a number of example results equal to X, each example result having a sum adjustment value and one or more geometry coverage values. The method then determines (at 2150) an adjustment equation or function that considers all X example results and explains how the sum adjustment value is derived from the one or more geometry coverage values. In other embodiments, other measurement values of the regions surrounding the feature are used by the method to determine an adjustment equation or function that explains how the sum adjustment value is derived. In some embodiments, the adjustment equation or function is determined automatically, without the need for human intervention.

In some embodiments, the method determines the adjustment equation or function using mathematical modeling methods. For example, each of the X number of example results can be put in the following equation form:

$$A = k_1 F_1 + k_2 F_2 \ldots$$

where A is the sum adjustment, $k_1$, $k_2$, etc. are coefficients, and $F_1$, $F_2$, etc. are geometry coverage values. Traditional data fitting methods (such as least square fitting method) can then be applied to the resulting X number of equations to determine the best values for the coefficients $k_1$, $k_2$, etc.

In other embodiments, the method determines the adjustment equation or function using computer learning methods. For example, each of the X number of example results can be inputted to a computer learning program (such as a neural network) that produces an adjustment function, the adjustment function explaining how the sum adjustment value is derived from the one or more geometry coverage values. In the computer learning method, no single mathematical model (e.g., linear, least square fit, etc.) is assumed and the number of coefficients ($k_1$, $k_2$, etc.) to be contained in the adjustment function is not predetermined (as in the mathematical model method). As such, the computer learning program considers any mathematical model and any number of coefficients in creating an adjustment function that explains the example results. The resulting adjustment function can have any equation form or may be in the form of a flowchart or internal model. Also, the resulting adjustment function contains the best values for any coefficients in the adjustment function.

Once the values of the coefficients of the adjustment equation or function are determined, the adjustment equation or function is determined. The adjustment equation or function can then be used, for example, by the adjustment method 1900 to determine (at 1935) an adjustment to be made to a pretabulated modification. Since the coefficients of the adjustment equation or function are predetermined, the adjustment can be calculated by inputting the geometry coverage percentages specified in the adjustment equation or function.

The method then stores (at 2155) the determined adjustment equation or function to the model created in step 830 of FIG. 8, the model containing data describing the current pretabulated environment. The method then ends.

Section VI: Modifying a Layout of a Layer on an IC Using Information Relating to Another Layer on the IC Conventionally, layouts are created for IC layers one layer at a time where the design of each layout progresses largely independent from the design of other layouts of the other layers. However, the metal coverage of a lower layer of an IC affects the vertical level of the layer above it (the upper layer), the metal coverage of a layer being a ratio of the area occupied by IC elements (such as IC components, interconnect lines, via pads, etc.) on the layer to the total area of the layer. The vertical level of a layer, in turn, affects the fabrication process of IC elements on the layer.

To illustrate, assume that if the metal coverage of the lower layer is considered "average," the upper layer sits atop the lower layer at a vertical level that is considered "normal." However, if the metal coverage of the lower layer is above "average," the upper layer sits atop the lower layer at a vertical level that is below "normal." And if the metal coverage of the lower layer is below "average," the upper layer sits atop the lower layer at a vertical level that is above "normal." This is due to the metal comprising the IC elements being softer than the photoresist material surrounding the metal on the lower layer. In the IC fabrication process, after the IC elements are created on the lower layer, the lower layer goes through a polishing process where the metal and the photoresist material surrounding the metal are ground down. Since the metal is softer than the photoresist material, a layer having a relatively high metal coverage will be polished down to a height that is lower than a layer having a relatively low metal coverage.

Therefore, a sub-region of an upper layer that is located directly above a sub-region of a lower layer having an above "average" metal coverage sits at a vertical level that is below "normal," and a sub-region of the upper layer that is located directly above a sub-region of a lower layer having a below "average" metal coverage sits at a vertical level that is above "normal." As such, there can be variations in the vertical level (i.e., vertical deviation from flatness or "normal" level) of the upper layer across the layer, depending on the variations in the metal coverage of the lower layer.

Variations in the vertical level at which an upper layer sits affects how the IC elements on the upper layer appear once fabricated. Recall that in the IC fabrication process, a light source and lens are used to focus light through a photomask onto a photoresist layer to imprint IC elements on the photoresist layer where the weakened areas of the photoresist layer are then etched away to produce the IC elements.

If there are variations in the vertical level at which a layer sits, the light that strikes the layer during the photomask process can not be in focus across the entire layer (since the distance to the lens through which the light is focused changes). Rather, the light will have various levels of defocus across the layer. The variations in the level of light defocus during the photomask process causes substantial disparity in geometries designed on a layout and created on a photomask and geometries actually fabricated (as IC elements) on a wafer.

To illustrate the concept of light defocus, assume that light striking a sub-region of a layer having a "normal" (flat) vertical level has a defocus value of 0 (so that the sub-region is considered to be the "correct" distance to the lens). Therefore, light striking a sub-region of a layer having an above "normal" vertical level may be said to have a defocus value of +DF, DF being a real number. Also, light striking a sub-region of a layer having a below "normal" vertical level may be said to have a defocus value of −DF.

In summary, the variations in metal coverage of a lower layer of an IC causes variations in the vertical level at which an upper layer of the IC sits, which in turn causes variations in the level of light defocus the photomask processing of the upper layer, which in turn causes substantial disparity between geometries designed on a layout for the upper layer and geometries actually fabricated (as IC elements) on a wafer. However, by designing and modifying geometries on a layout for the upper layer by taking into consideration the variations in metal coverage of the lower layer and vertical deviation data (topographic data) of the upper layer, the disparity between the geometries designed on the layout for the upper layer and the geometries actually fabricated on the upper layer can be reduced.

In some embodiments of the present invention, geometries in a layout for a layer of an IC are modified based on topographic data (vertical deviation data) of the layer. In some embodiments, a layout designed to be fabricated on an upper layer of an IC is modified using information relating to a layout designed to be fabricated on another layer of the IC.

Figure 22:
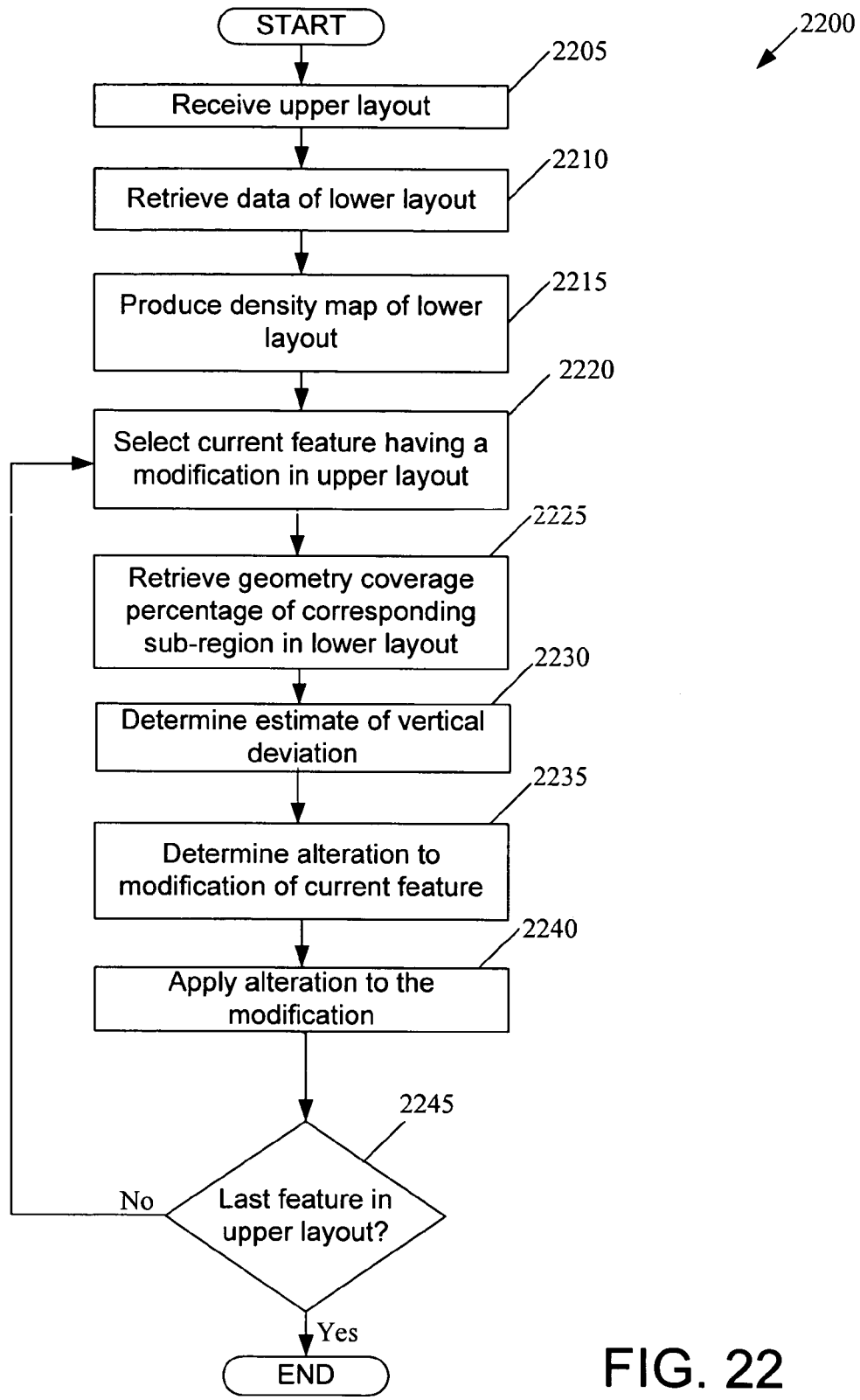
FIG. 22 is a flowchart of an altering method for altering modifications to geometries in a layout for an upper layer of an IC using information relating to a layout for a lower layer of the IC.

FIG. 22 is a flowchart of an altering method 2200 for altering modifications to geometries in a layout for an upper layer of an IC using information relating to a layout for a lower layer of the IC. The method 2200 can be implemented, for example, by an electronic design automation ("EDA") application that creates, edits, or analyzes IC design layouts. FIG. 22 is described in relation to FIG. 23. The method 2200 begins when it receives (at 2205) a layout (upper layout) for an upper layer of an IC (i.e., a layer that is to be fabricated on the IC other than the bottom layer), the layout containing geometries, features, and modifications to features. In some embodiments, the upper layout is produced by using a pretabulated library of models (as discussed above in Section II. In other embodiments, upper layout is produced by using different methods, such as conventional layout design methods.

The method 2200 then retrieves (at 2210) data of a layout (lower layout) for a lower layer of the IC (i.e., a layer that is to be fabricated on the IC lower than the upper layer). The data of the lower layout describes geometries on the lower layout and include dimension and placement data of the geometries. Using the data of the lower layout, the method then produces (at 2215) a density map of the lower layout, the density map indicating a percentage of geometry coverage in each sub-region of the lower layout. The percentage of geometry coverage for a sub-region is defined as the area covered by geometries in the sub-region divided by the total area of the sub-region multiplied by 100. The percentage of geometry coverage for a sub-region reflects the metal coverage of the sub-region when the geometries in the sub-region are later fabricated as IC elements on a wafer. In other embodiments, the method produces (at 2215) another description (other than a density map) of the properties of the lower layout, such as a function, wavelet, etc.

Figure 23:
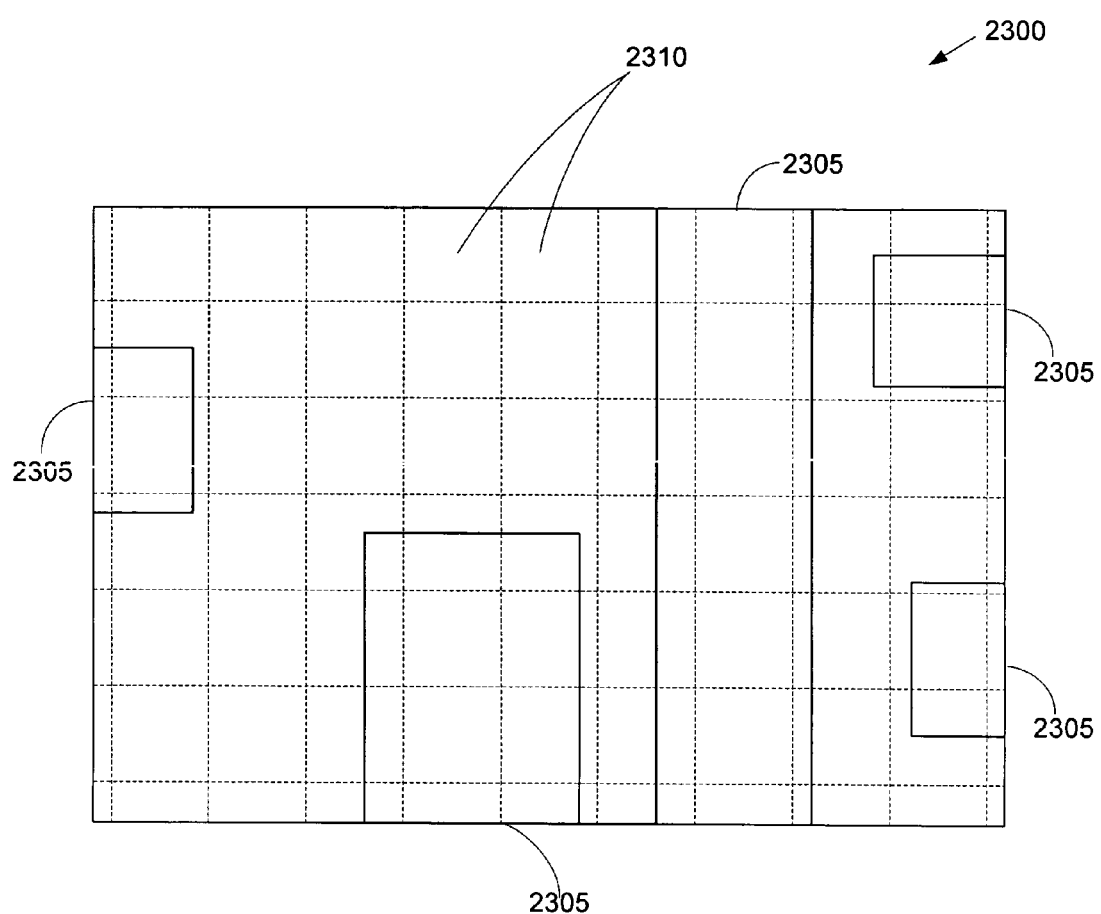
FIG. 23 shows a top-view diagram of a portion of a lower layout that has been divided into sub-regions.

In some embodiments, the method 2200 produces (at 2215) a density map of the lower layout by 1) dividing the lower layout into sub-regions, and 2) for each sub-region, determining the percentage of geometry coverage in the sub-region. FIG. 23 shows a top-view diagram of a portion 2300 of a lower layout containing geometries 2305 that may represent various IC elements such as circuit modules, interconnect lines, or via pads that are to be fabricated on a wafer. As shown in FIG. 23, the portion 2300 of the lower layout is divided into sub-regions 2310. In some embodiments, for each sub-region 2310, a percentage of geometry coverage is determined.

After producing a density map of the lower layout, the method then selects (at 2220) a current feature (having a modification) in the upper layout for processing. The method retrieves (at 2225), from the density map, the percentage of geometry coverage of the sub-region of the lower layout that is designed to be fabricated below the current feature. Typically, a first area on a first layer of an IC having the same span of x and y coordinates as a second area on a second different layer of the IC will be fabricated directly above or below second area, the first and second areas being referred to as corresponding areas. As such, the method may perform step 2225 by 1) determining the x and y coordinates of the current feature, 2) determining a corresponding sub-region of the lower layout having a span of x and y coordinates that encompasses the x and y coordinates of the current feature, and 3) retrieving the percentage of geometry coverage of the corresponding sub-region.

Using the percentage of geometry coverage in the corresponding sub-region of the lower layout, the method then determines (at 2230) an estimate of vertical deviation from "normal" or flatness of the current feature on the upper layout, i.e., the distance that the current feature is estimated to sit at a vertical level away from a "normal" vertical level once fabricated on a wafer. The "normal" vertical level is predetermined, for example, by setting the "normal" vertical level to a vertical level that a feature on an upper layer is estimated to sit (once fabricated) when a corresponding sub-region in a lower layout has a predetermined "average" percentage of geometry coverage, e.g., 25%, 50%, etc.

In some embodiments, the method determines the estimate of vertical deviation of the current feature on the upper layout using a set of rules in a predetermined look-up table. The look-up table lists various geometry coverage percentages of a sub-region on a lower layout and correlates each geometry coverage percentage with a particular estimate of vertical deviation for a corresponding feature on an upper layout. For example, the look-up table may correlate a 5% geometry coverage of a sub-region on a lower layout with a +10 nm estimate of vertical deviation for a corresponding feature on an upper layout, a 20% geometry coverage of a sub-region on a lower layout with a +2 nm estimate of vertical deviation for a corresponding feature on an upper layout, a 75% geometry coverage of a sub-region on a lower layout with a −7 nm estimate of vertical deviation for a corresponding feature on an upper layout, etc.

After determining the estimate of vertical deviation of the current feature on the upper layout, the method 2200 then determines (at 2235) an alteration to the modification of the current feature based on the estimate of vertical deviation of the current feature. In some embodiments, the method determines the alteration to the modification of the current feature using a set of rules in a predetermined look-up table. The look-up table lists various estimates of vertical deviation for a feature and correlates each estimate with a particular alteration that is to be applied to a modification of the feature. The alteration may be expressed, for example, as a percentage amount that the modification of the current feature is to be increased or decreased, or a distance that each side of the modification of the current feature is to be increased or decreased. For example, the look-up table may correlate a +10 nm estimate of vertical deviation for a feature with an increase of 5% to the modification of the feature, a +5 nm estimate of vertical deviation for a feature with an increase of 2 nm to a each side of the modification of the feature, etc.

The look-up table used in step 2235 may be created by performing simulations on various features (having modifications) at various vertical deviations and determining the effect of the vertical deviations on the features and any alterations to the modifications of the features that should be made. For example, through simulations, it may be determined that a +10 nm vertical deviation of a feature pushes the feature inward by 5 nm, and thus a 5 nm to a particular side of the modification of the feature is needed. Accordingly, these determinations would be reflected in the look-up table. The simulations of the features described above can be performed by a simulator program that takes into account the process variation of lens defocus, the level of lens defocus being related to the level of vertical deviation of the feature (as discussed above).

In some embodiments, the method does not determine (at 2230) an estimate of vertical deviation, but rather determines (at 2235) an alteration to the modification of the current feature directly from the percentage of geometry coverage in the corresponding sub-region of the lower layout. This can be performed, for example, using a set of rules in a predetermined look-up table that lists various geometry coverage percentages in the lower layout and correlates each geometry coverage percentage with a particular alteration that is to be applied to a modification of the feature. For example, the look-up table may correlate a 30% geometry coverage with a 2 nm increase in the modification.

After the method 2200 determines (at 2235) an alteration to the modification of the current feature, the method 2200 then applies (at 2240) the alteration to the modification of the current feature. The method then determines (at 2245) whether the current feature is the last feature in the upper layout. If not, the method proceeds to step 2220 and selects a next current feature (having a modification) in the upper layout for processing. If so, the method ends.

Several methods of the present invention may be adapted to incorporate some of the processing features of the altering method 2200 of FIG. 22. For example, the general design method 300 for designing integrated circuit layouts (described in relation to FIG. 3) can be so adapted. For example, after step 325 of the general design method 300, a satisfactory layout producing a satisfactory simulated layout is achieved, the satisfactory layout having features with modifications. Assuming that the satisfactory is designed for an upper layer of an IC, the altering method 2200 of FIG. 22 can then be used to alter the modifications to the features in the satisfactory layout, the alterations being based on information relating to a layout designed for a lower layer of the IC.

The layout modification method 700 for modifying geometries in an IC layout using a library of pretabulated models (described in relation to FIG. 7) can also be so adapted. For example, after step 735 of the layout modification method 700, a design layout having pretabulated modifications applied to features in a design layout is produced. Assuming that the design layout is designed for an upper layer of an IC, the altering method 2200 of FIG. 22 can then be used to alter the pretabulated modifications to the features in the design layout, the alterations being based on information relating to a layout designed for a lower layer of the IC.

The library building method 800 for building a library of pretabulated models (described in relation to FIG. 8) can also be adapted to alter the pretabulated modifications in the pretabulated models. For this embodiment, it can be assumed that the pretabulated models of library contain features designed for a layout of an upper layer of an IC. After step 825 of the library building method 800, a modification to a feature that produces a satisfactory simulated feature is achieved, the modification being referred to as the pretabulated modification which is to be stored (at 830) to a model.

In some embodiments, the library building method 800 is adapted so that, after step 825, various examples of geometry coverage percentages (e.g., 5%, 10%, 15%, etc.) that may exist in a layout designed for a lower layer of the IC are determined. For each example of geometry coverage, an alteration of the pretabulated modification is determined. This can be done by determining a vertical deviation resulting from each geometry coverage (for example, through use of a look-up table, as discussed above in relation to FIG. 22), and then determining an alteration based on the vertical deviation (for example, through use of a look-up table, as discussed above in relation to FIG. 22). Each alteration to the pretabulated modification is then stored in a separate model along with the geometry coverage percentage to which the alteration applies.

By doing such, a pretabulated library of models can be created where some or all models contain a modification of a feature that is based, in part, on information relating to a layout designed for a lower layer of an IC (i.e., a layer that is to be fabricated on a layer lower than the feature). In some embodiments, the information relating to the lower layout is the percentage of geometry coverage on the lower layout. In some embodiments, a pretabulated library of models is created where some or all models contain a modification of a feature that is based, in part, on topographic data (vertical deviation data) of the feature.

Figure 24:
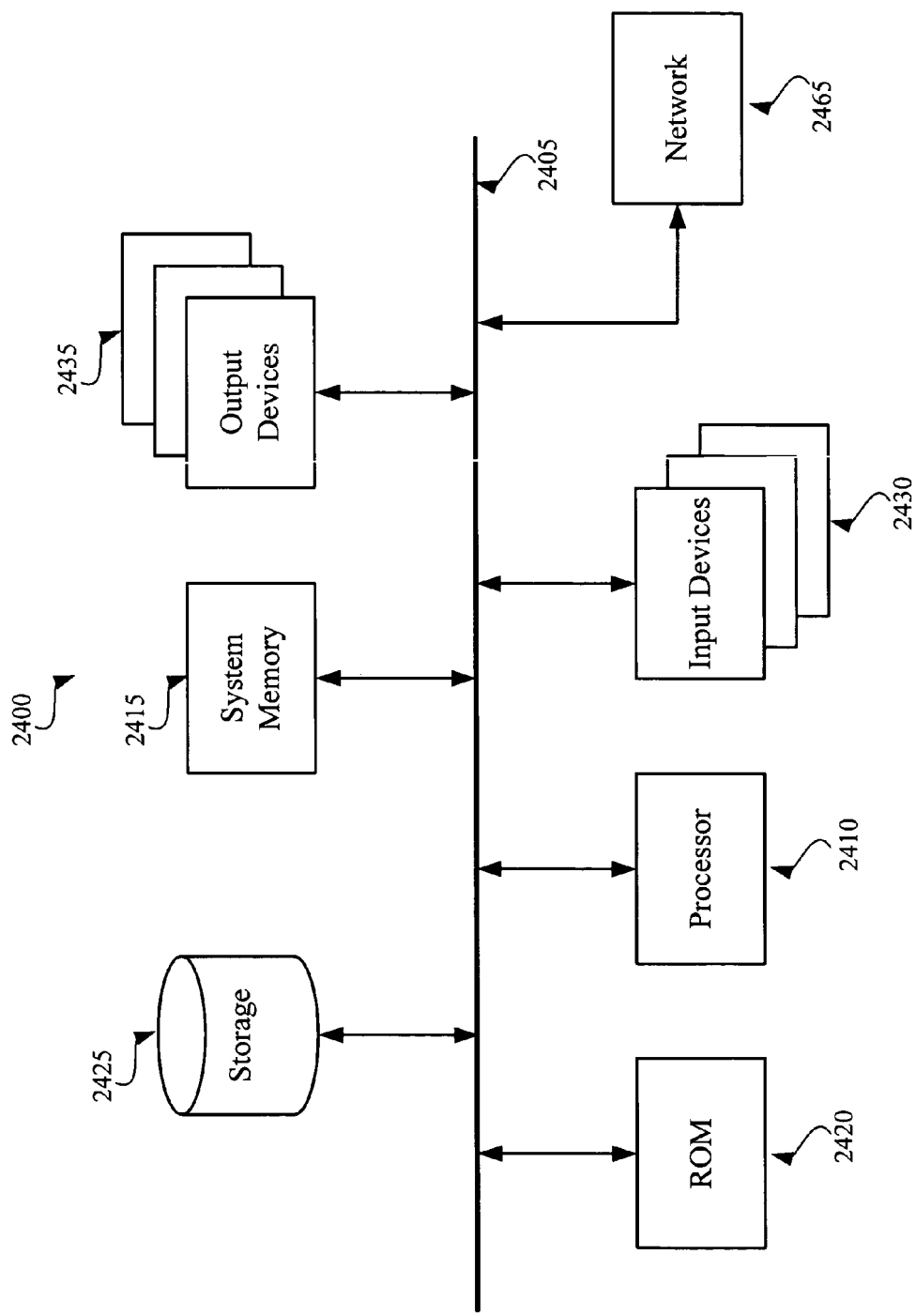
FIG. 24 conceptually illustrates a computer system with which some embodiments of the invention are implemented.

FIG. 24 conceptually illustrates a computer system with which some embodiments of the invention are implemented. Computer system 2400 includes a bus 2405, a processor 2410, a system memory 2415, a read-only memory 2420, a permanent storage device 2425, input devices 2430, and output devices 2435.

The bus 2405 collectively represents all system, peripheral, and chipset buses that support communication among internal devices of the computer system 2400. For instance, the bus 2405 communicatively connects the processor 2410 with the read-only memory 2420, the system memory 2415, and the permanent storage device 2425.

From these various memory units, the processor 2410 retrieves instructions to execute and data to process in order to execute the processes of the invention. The read-only memory (ROM) 2420 stores static data and instructions that are needed by the processor 2410 and other modules of the computer system. The permanent storage device 2425, on the other hand, is a read-and-write memory device. This device is a non-volatile memory unit that stores instruction and data even when the computer system 2400 is off. Some embodiments of the invention use a mass-storage device (such as a magnetic or optical disk and its corresponding disk drive) as the permanent storage device 2425. Other embodiments use a removable storage device (such as a floppy disk or zip® disk, and its corresponding disk drive) as the permanent storage device.

Like the permanent storage device 2425, the system memory 2415 is a read-and-write memory device. However, unlike storage device 2425, the system memory is a volatile read-and-write memory, such as a random access memory. The system memory stores some of the instructions and data that the processor needs at runtime. In some embodiments, the invention's processes are stored in the system memory 2415, the permanent storage device 2425, and/or the read-only memory 2420.

The bus 2405 also connects to the input and output devices 2430 and 2435. The input devices enable the user to communicate information and select commands to the computer system. The input devices 2430 include alphanumeric keyboards and cursor-controllers. The output devices 2435 display images generated by the computer system. For instance, these devices display IC design layouts. The output devices include printers and display devices, such as cathode ray tubes (CRT) or liquid crystal displays (LCD).

Finally, as shown in FIG. 24, bus 2405 also couples computer 2400 to a network 2465 through a network adapter (not shown). In this manner, the computer can be a part of a network of computers (such as a local area network ("LAN"), a wide area network ("WAN"), or an Intranet) or a network of networks (such as the Internet). Any or all of the components of computer system 2400 may be used in with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. Thus, one of ordinary skill in the art would understand that the invention is not limited by the foregoing illustrative details, but rather is to be defined by the appended claims.

The invention claimed is:

1. A method for modifying a layout comprising a plurality geometries using a library of models, each geometry in the layout having a set of features for modifying and each model in the library comprising a pretabulated environment comprised of a pretabulated feature, a pretabulated modification of the pretabulated feature, and one or more pretabulated geometries, the method comprising:
   a) selecting a current feature in the layout;
   b) identifying a current environment in the layout containing the current feature;
   c) identifying a model in the library having a pretabulated environment that matches the current environment;
   d) retrieving, from the matching model, a pretabulated modification; and
   e) applying the pretabulated modification to the current feature.

2. The method of claim 1 further comprising:
repeating steps a) through e) for each feature in the layout.

3. The method of claim 1 wherein the pretabulated modification is designed to produce a fabricated feature that is within a predetermined variance from the current feature.

4. The method of claim 1 wherein the pretabulated modification produces a simulated feature that is within a predetermined variance from the pretabulated feature.

5. The method of claim 1 further comprising:
after selecting the current feature, determining whether the current feature is located within a processed region;
if determined that the current feature is located within a processed region, selecting another current feature in the layout; and
after applying the pretabulated modification to the current feature, identifying a processed region about the current feature.

6. The method of claim 1 wherein the current feature is a corner, bend, or line-point on a geometry in the layout.

7. The method of claim 1 wherein the geometries in the layout represent elements that are to be fabricated on a wafer.

8. The method of claim 1 wherein:
the current environment contains one or more geometries; and
identifying the model in the library having a pretabulated environment that matches the current environment comprises:
identifying a pretabulated environment that contains one or more geometries having dimensions and placement that matches the dimensions and placement of the one or more geometries in the current environment.

9. The method of claim 1 wherein the matching model contains a pretabulated environment within a predetermined variance from the current environment.

10. The method of claim 1 further comprising:
after identifying the current environment in the layout, determining whether any model in the library has a pretabulated environment that matches the current environment; and
if it is determined that no model in the library has a pretabulated environment that matches the current environment, determining a modification to the current feature using a rule-based approach.

11. The method of claim 1 further comprising:
after identifying the current environment in the layout, determining whether any model in the library has a pretabulated environment that matches the current environment; and
if it is determined that no model in the library has a pretabulated environment that matches the current environment, creating a new model in the library having a pretabulated environment that replicates the current environment and a pretabulated modification for a pretabulated feature that replicates the current feature.

12. The method of claim 11 wherein the library of models is created and the layout is modified simultaneously, wherein the library only contains models having pretabulated environments that replicate environments that have previously been identified in the layout during modification of the layout.

13. The method of claim 1 wherein each model further comprises a simulated environment that is a simulation of the pretabulated environment, the method further comprising:
retrieving, from the matching model, the simulated environment.

14. The method of claim 1 wherein each model further comprises a simulated environment that is a simulation of the pretabulated environment reflecting one or more process variations, the method further comprising:
retrieving, from the matching model, the simulated environment.

15. The method of claim 1 wherein each model further comprises a description of an electrical characteristic of the pretabulated environment, the method further comprising:
retrieving, from the matching model, the electrical characteristic.

16. The method of claim 1 wherein each model further comprises a characteristic equation that expresses a specific electrical characteristic of the pretabulated environment as a function of one or more process variations, the method further comprising:
retrieving, from the matching model, the characteristic equation.

17. The method of claim 1 wherein each model further comprises a characteristic equation that expresses a specific electrical characteristic of the pretabulated environment as a function of dimensions and placement of the one or more geometries in the pretabulated environment;
the method further comprising:
retrieving, from the matching model, the characteristic equation.

18. The method of claim 1 wherein each model further comprises an adjustment equation or function used to determine an adjustment to the pretabulated modification in the model, the method further comprising:
retrieving, from the matching model, the adjustment equation or function.

19. The method of claim 18 wherein the adjustment equation or function uses at least one geometry coverage percentage of a specific area in the layout, the method further comprising:
after retrieving the pretabulated modification and the adjustment equation or function, determining at least one geometry coverage percentage of an area in the layout specified in the adjustment equation or function;
determining an adjustment using the adjustment equation and the at least one geometry coverage percentage; and
applying the adjustment to the pretabulated modification, wherein applying the pretabulated modification to the current feature comprises applying the adjusted pretabulated modification to the current feature.

20. The method of claim 19 wherein the area in the layout specified in the adjustment equation or function is a region between an inner predetermined radius distance and an outer predetermined radius distance from the current feature.

21. The method of claim 2 wherein after repeating steps a) through e) for each feature in the layout, a modified layout is produced having a plurality of features and a plurality of modifications to features, the modified layout being designed to be fabricated on a first layer of an integrated circuit, the method further comprising:
altering the modified layout using data relating to a second layout being designed to be fabricated on a second layer of the integrated circuit.

22. The method of claim 21 wherein:
the second layer is lower than the first layer in the integrated circuit; and
the altering comprises:
producing a density map of the second layout using the data relating to the second layout, the density map indicating geometry coverage percentages in sub-regions of the second layout;
selecting a current feature having a current modification in the modified layout;
retrieving, from the density map, the geometry coverage percentage of a sub-region of the second layout that is designed to be fabricated below the current feature; determining an alteration to the current modification of the current feature based on the geometry coverage percentage; and applying the alteration to the current modification of the current feature.

23. The method of claim 22 wherein determining the alteration to the current modification comprises:

determining an estimate of vertical deviation of the current feature based on the geometry coverage percentage; and determining the alteration to the current modification based on the vertical deviation.

24. A method for creating a library of models used to modify a layout, the method comprising:

creating a set of pretabulated environments, each pretabulated environment containing a pretabulated feature and one or more pretabulated geometries; and for each pretabulated environment in the set:

creating a pretabulated modification to the pretabulated feature in the pretabulated environment that produces a satisfactory simulation of the pretabulated environment; and creating a model of the pretabulated environment comprised of the pretabulated feature, the pretabulated modification, and the one or more pretabulated geometries.

25. The method of claim 24 wherein the set of pretabulated environments is tailored towards layouts having a particular preferred-direction wiring.

26. The method of claim 25 wherein the preferred-direction wiring is Manhattan or diagonal preferred-direction wiring.

27. The method of claim 24 wherein the set of pretabulated environments is tailored towards layouts having no particular preferred-direction wiring.

28. The method of claim 24 further comprising:

for each pretabulated environment in the set, storing the satisfactory simulation of the pretabulated environment to the model created for the pretabulated environment.

29. The method of claim 24 further comprising:

for each pretabulated environment in the set:

producing a re-simulation of the pretabulated environment having the pretabulated modification created for the pretabulated environment, the re-simulation reflecting one or more process variations; and storing the re-simulation of the pretabulated environment to the model created for the pretabulated environment.

30. The method of claim 24 wherein the one or more process variations are lens defocus or light dosage.

31. The method of claim 24 further comprising:

for each pretabulated environment in the set, storing electrical characteristic data of the pretabulated environment to the model created for the pretabulated environment.

32. The method of claim 31 wherein the electrical characteristic data relates to capacitance, inductance, or resistance.

33. The method of claim 24 further comprising:

for each pretabulated environment in the set, storing a characteristic equation to the model created for the pretabulated environment, the characteristic equation expressing an electrical characteristic of the pretabulated environment as a function of dimensions and placement of one or more pretabulated geometries in the pretabulated environment.

34. The method of claim 33 wherein the electrical characteristic is capacitance and the characteristic equation is in the form:

$$C=C_0+k_1\Delta W$$

where C is the capacitance between two geometries in a re-simulation of the pretabulated environment reflecting one or more process variations, $C_0$ is an initial capacitance between the two geometries of a simulation of the pretabulated environment reflecting no process variations, $k_1$ is a predetermined coefficient, and $\Delta W$ is the difference in distance between the two geometries from the re-simulation to the simulation.

35. The method of claim 24 further comprising:

for each pretabulated environment in the set, storing a characteristic equation to the model created for the pretabulated environment, the characteristic equation expressing an electrical characteristic of the pretabulated environment as a function of one or more process variations.

36. The method of claim 35 wherein the electrical characteristic is capacitance and the characteristic equation is in the form:

$$C=C_0+k_1\Delta W+k_2\Delta PV_1+\ldots$$

where C is the capacitance between two geometries in a re-simulation of the pretabulated environment reflecting one or more process variations, $C_0$ is an initial capacitance between the two geometries of a simulation of the pretabulated environment reflecting no process variations, $k_1$ and $k_2$ are predetermined coefficients, $\Delta W$ is the difference in distance between the two geometries from the re-simulation to the simulation, and $\Delta PV_1$ is the difference in value of a process variation reflected in the re-simulation and the simulation.

37. The method of claim 35 wherein the characteristic equation is in the form:

$$C=C_0+k_1\Delta W+k_2\Delta DF+k_3\Delta \text{dosage}$$

where C is the capacitance between two geometries in a re-simulation of the pretabulated environment reflecting one or more process variations, $C_0$ is an initial capacitance between the two geometries of a simulation of the pretabulated environment reflecting no process variations, $k_1$, $k_2$, and $k_3$ are predetermined coefficients, $\Delta W$ is the difference in distance between the two geometries from the re-simulation to the simulation, $\Delta DF$ is the difference in defocus values reflected in the re-simulation and the simulation, and $\Delta$dosage is the difference in light dosage values reflected in the re-simulation and the simulation.

38. The method of claim 24 further comprising:

for each pretabulated environment in the set, storing an adjustment equation or function to the model created for the pretabulated environment, the adjustment equation or function being used to determine an adjustment to the pretabulated modification created for the pretabulated environment.

39. The method of claim 38 wherein the adjustment equation or function uses at least one geometry coverage percentage of a specific area in the layout to determine the adjustment to the pretabulated modification.

40. The method of claim 24 further comprising:

for each pretabulated environment in the set:

producing a re-simulation of the pretabulated environment having the pretabulated modification created for the pretabulated environment, the re-simulation reflecting one or more geometry coverage percentages of specific areas surrounding the pretabulated feature in the pretabulated environment;

determining a sum adjustment that is applied to the pretabulated modification created for the pretabulated environment that produces a satisfactory re-simulation of the pretabulated environment;

storing the sum adjustment and the one or more geometry coverage percentages as an example result;

determining an adjustment equation of function that considers all example results and expresses how the sum adjustment is derived from the one or more geometry coverage values; and storing the adjustment equation of function to the model created for the pretabulated environment.

41. The method of claim 1, wherein each of a plurality of the sets has no features for modifying.

* * * * *

UNITED STATES PATENT AND TRADEMARK OFFICE
CERTIFICATE OF CORRECTION

PATENT NO. : 7,082,588 B2  
APPLICATION NO. : 10/836581  
DATED : July 25, 2006  
INVENTOR(S) : Scheffer et al.

Page 1 of 1

It is certified that error appears in the above-identified patent and that said Letters Patent is hereby corrected as shown below:

<u>Title Page,</u>  
Item [57], ABSTRACT, Line 4 reads "to the feature that us calculated"  
should read (correction of language) -- to the feature that is calculated --

Line 10-11 read "and/or describing an adjustment"  
should read (addition) -- and/or data describing an adjustment --

Line 13 reads "In some embodiments, and"  
should read (correction of language) -- In some embodiments, an --

Line 14 reads "upper layer for an upper layer of an IC"  
should read (correction of language) -- upper layout for an upper layer of an IC --

Signed and Sealed this

Twenty-first Day of August, 2007

JON W. DUDAS  
*Director of the United States Patent and Trademark Office*